United States Patent [19]

Ty Tan et al.

[11] Patent Number: 5,148,267

[45] Date of Patent: Sep. 15, 1992

[54] DOUBLE HETEROSTRUCTURE STEP RECOVERY DIODE WITH INTERNAL DRIFT FIELD

[75] Inventors: Michael R. Ty Tan, Mountain View; Shih Y. Wang; John L. Moll, both of Palo Alto, all of Calif.

[73] Assignee: Hewlett-Packard Company, Palo Alto, Calif.

[21] Appl. No.: 708,950

[22] Filed: May 31, 1991

Related U.S. Application Data

[63] Continuation-in-part of Ser. No. 404,306, Sep. 8, 1989, abandoned.

[51] Int. Cl.⁵ .................. H01L 29/163; H01L 29/203; H01L 29/36; H01L 29/86
[52] U.S. Cl. ........................ 357/16; 357/58; 357/90
[58] Field of Search ............... 357/16, 17, 58, 89, 357/90

[56] References Cited

U.S. PATENT DOCUMENTS

| | | | |
|---|---|---|---|
| 4,546,480 | 10/1985 | Burnham et al. | 357/16 |
| 4,604,636 | 8/1986 | Dalal | 357/2 |
| 4,738,933 | 4/1988 | Richards | 357/68 |

FOREIGN PATENT DOCUMENTS

| | | | |
|---|---|---|---|
| 57-114525 | 6/1982 | Japan . | |
| 59-004178 | 1/1984 | Japan | 357/30 |
| 59-108513 | 5/1984 | Japan . | |
| 59-171534 | 8/1984 | Japan . | |
| 60-253282 | 12/1985 | Japan | 357/30 |
| 63-122281 | 11/1986 | Japan . | |
| 63-158862 | 12/1986 | Japan . | |

OTHER PUBLICATIONS

John L. Moll, "Physical Modeling of the Step Recovery Diode for Pulse and Harmonic Generation Circuits", Proceedings of the IEEE, vol. 57, No. 7, Jul. 1969.
William P. Dumke, "Spontaneous Radiative Recombination in Semiconductors", Physical Review, vol. 105, No. 1, Jan. 1, 1957, p. 139.
P. Asbeck, "Self-Absorption Effects on the Radiative Lifetime in GaAs-GaAlAs Double Heterostructures", Journal of Applied Physics, vol. 48, No. 2, Feb. 1977.
R. J. Nelson et al, "Interfacial Recombination Velocity in GaAlAs/GaAs Heterostructures", Appl. Phys. Lett., 32(11), Jun. 1, 1976, p. 761.
Casey and Panesh, "Heterostructure Lasers", Academic Press, 1978.
L. A. Davidson, et al., "Charge-Storage Diode Fabrication", IBM Technical Bulletin, vol. 9, No. 1, Jun. 1966.
Charles M. Wolfe, et al., "Physical Properties of Semiconductors", Prentice Hall, Englewood Cliffs, N.J., 1989, pp. 251–252.
Capasso & Margoritondo, "Heterojunction Band Discontinuities".
J. P. R. David et al., "The Electron Impact Ionization Rate and Breakdown Voltage in GaAs/Ga$_{0.7}$Al$_{0.3}$As MQW Structures", IEEE Electron Device Letters, vol. 10, No. 7, Jul. 1989, pp. 294–296.
T. E. Zipperian et al., "A Novel p+nn+ GaAs/Al$_{0.30}$Ga$_{0.70}$As/GaAs Double Heterojunction Diode for High-Temperature Electronic Applications", Appl. Phys. Lett. 40(10), May 15, 1982, pp. 901–904.

Primary Examiner—William D. Larkins

[57] ABSTRACT

A double heterostructure step recovery diode having a very fast step transition time and a high output voltage. A highly doped, wide bandgap p-type region; a narrow bandgap intrinsic region; and a highly doped, wide bandgap n-type region define a PIN diode structure. The intrinsic region forms heterojunctions with the p and n regions. Highly doped, narrow bandgap p and n contact regions adjoin the wide bandgap p and n regions, respectively and form heterojunctions therewith. Very thin, highly doped, narrow bandgap p and n regions are located between the intrinsic region and the wide bandgap p and n regions, respectively. Optional graded bandgap p-type and n-type regions are located between the wide and narrow bandgap p and n regions. In one embodiment the diode is embedded in an undoped wide bandgap material. In an alternate version, the intrinsic region is replaced with a lightly-doped p-type charge storage region to reduce the slow tail portion of the step recovery. An electric field, generated by a graded doping level or a graded bandgap structure, also reduces the slow tail.

22 Claims, 21 Drawing Sheets

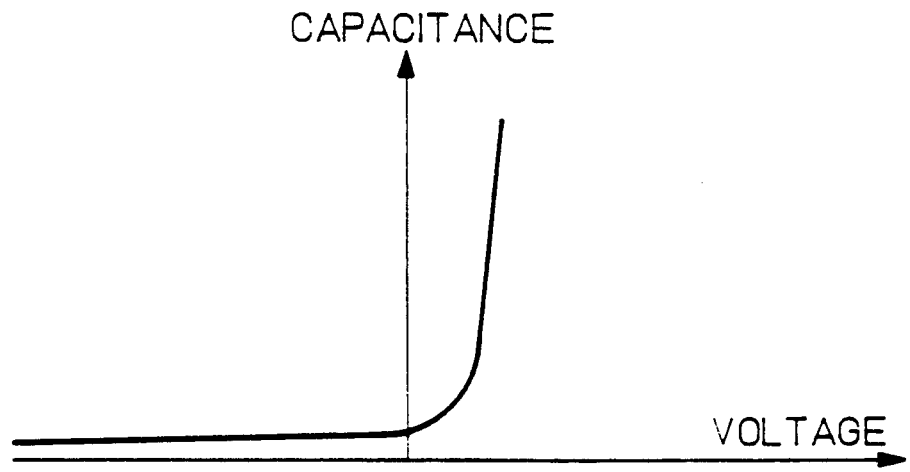

ZERO BIAS

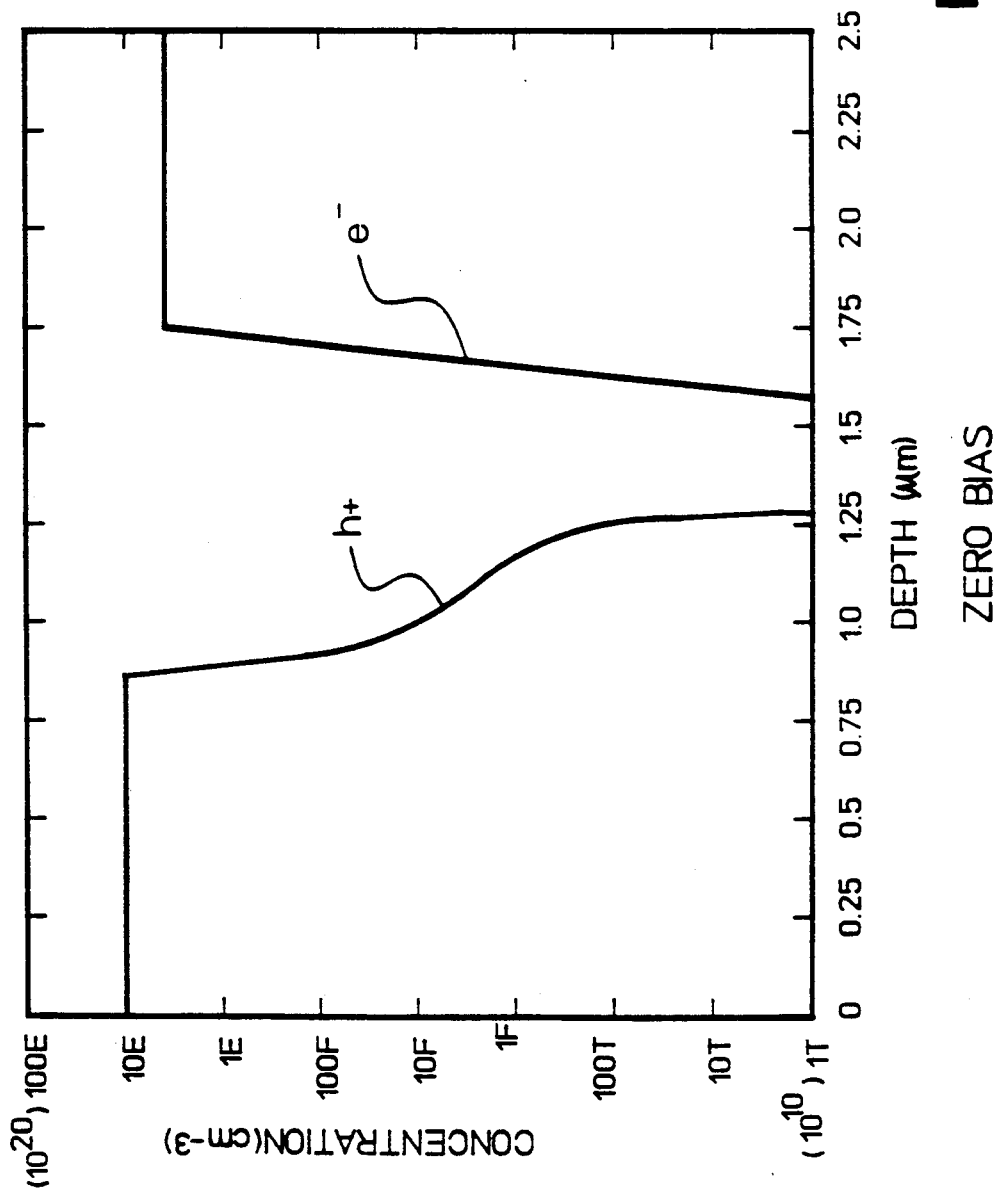

FORWARD BIAS

FORWARD BIAS

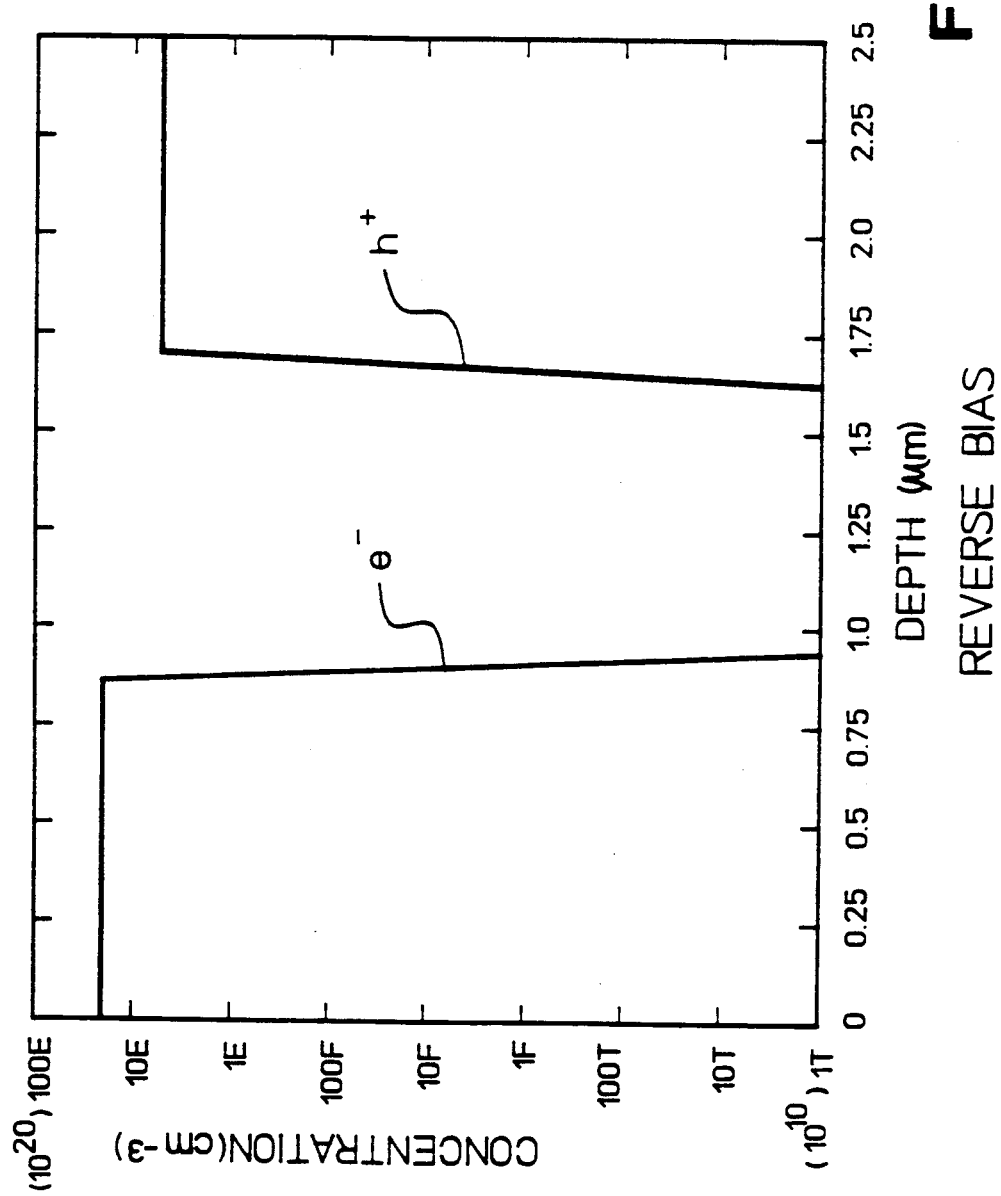

(x = 0.3)

| | | | | |
|---|---|---|---|---|
| p⁺ GaAs | p>1·10²⁰ | 5,000 Å | ⌐1310 | 1309 |
| p⁺ Al$_x$Ga$_{1-x}$As | P>1·10²⁰ | 4,000 Å | ⌐1312 | 1308 |
| P⁺ Al$_y$Ga$_{1-y}$As | P>1·10¹⁹ | 250 Å | y=x / y=0 | 1307 |
| p⁺ GaAs | p>1·10¹⁹ | 100 Å | | 1306 |
| p GaAs | p=1·10¹⁷ | 4,000 Å | | 1305 |
| ⁺n GaAs | n=8·10¹⁸ | 100 Å | | 1304 |
| N⁺ Al$_y$Ga$_{1-y}$As | N=8·10¹⁸ | 250 Å | y=0 / y=x | 1303 |
| N⁺ Al$_x$Ga$_{1-x}$As | N=8·10¹⁸ | 4,000 Å | ⌐1313 | 1302 |
| n⁺ GaAs | N=8·10¹⁸ | 10,000 Å | ⌐1311 | 1301 |
| 15 PERIOD SUPERLATTICE | | | | 1314 |
| SEMI-INSULATING OR n⁺ GaAs SUBSTRATE | | | | 1300 |

| p⁺ GaAs | p>1·10²⁰ | 5,000 Å | 1309 |

─ ─ ─ ─ ─ ─ ─ ─ ─ ─ ─ ─ 1310 ─ ─

| P⁺ Al$_x$Ga$_{1-x}$As | P>1·10²⁰ | 4,000 Å | 1308 |

─ ─ ─ ─ ─ ─ ─ ─ ─ ─ ─ 1312 ─ ─ ─

| P⁺ Al$_y$Ga$_{1-y}$As | P>1·10¹⁹ | 250 Å | y=x, y=0 | 1307 |

─ ─ ─ ─ ─ ─ ─ ─ ─ ─ ─ ─ ─ ─ ─ ─

| p⁺ GaAs | p>1·10¹⁹ | 100 Å | 1306 | p= 10¹⁷
                                                   1414
GRADED p  GaAs   3,500 Å           1305
LINEAR OR EXPONENTIAL GRADING
p=5·10¹⁴
                                                   1415
─ ─ ─ ─ ─ ─ ─ ─ ─ ─ ─ ─ ─ ─ ─ ─

| ⁺n GaAs | n=8·10¹⁸ | 100 Å | 1304 |

─ ─ ─ ─ ─ ─ ─ ─ ─ ─ ─ ─ ─ ─ ─ ─

| N⁺ Al$_y$Ga$_{1-y}$As | N=8·10¹⁸ | 250 Å | y=0, y=x | 1303 |

─ ─ ─ ─ ─ ─ ─ ─ ─ ─ ─ 1313 ─ ─ ─

| N⁺ Al$_x$Ga$_{1-x}$As | N=8·10¹⁸ | 4,000 Å | 1302 |

─ ─ ─ ─ ─ ─ ─ ─ ─ ─ ─ 1311 ─ ─ ─

| n⁺ GaAs | N=8·10¹⁸ | 6,000 Å | 1301 |

─ ─ ─ ─ ─ ─ ─ ─ ─ ─ ─ ─ ─ ─ ─ ─

15 PERIOD SUPERLATTICE          1314

─ ─ ─ ─ ─ ─ ─ ─ ─ ─ ─ ─ ─ ─ ─ ─

SEMI-INSULATING OR n⁺ GaAs SUBSTRATE   1300

FIG 14

InGaAs:Zn    p > 2·10$^{19}$    0.4 microns

InP:Zn    P > 1.0·10$^{18}$    0.2 microns undoped InGaAsP    (1.1ev)    0.5 microns InP:Se    N > 1.8·10$^{18}$    0.2 microns InGaAs:Se    n > 5·10$^{18}$    0.8 Microns Semi-insulating or n$^+$ InP Substrate

Figure 20

DOUBLE HETEROSTRUCTURE STEP RECOVERY DIODE WITH INTERNAL DRIFT FIELD

CROSS-REFERENCE

This is a continuation-in-part of application Ser. No. 07/404,306 filed Sep. 8, 1989, now abandoned.

FIELD OF THE INVENTION

This invention relates in general to step recovery diodes and more particularly to a double heterostructure step recovery diode characterized by wide and narrow bandgap regions.

BACKGROUND OF THE INVENTION

Step recovery diodes are used to produce pulses and other waveforms with extremely fast rise and fall times (about 30 picoseconds). Such diodes are also commonly used in harmonic frequency multipliers because of their high efficiency in generating harmonics.

A step recovery diode is a specialized kind of PIN diode. Generally, a PIN diode is characterized by an undoped intrinsic ("i") region sandwiched between a heavily p-doped ("p") region and a heavily n-doped ("n") region. As used herein, "undoped" means not intentionally doped, "lightly doped" means a dopant has been added to a doping level less than about $10^{17}$ dopant particles $cm^{-3}$ (per cubic centimeter), and "heavily doped" means a dopant has been added to a doping level on the order of $10^{17}$ $cm^{-3}$ or more. A heavily doped region will be indicated herein by a superscripted "+" sign appended to the p or n designator.

The step recovery diode is a specialized adaptation of this general PIN diode structure. The step recovery diode, by virtue of its unique application, is subject to special design constraints that are different from those applicable to other kinds of PIN diodes. For example, a step recovery diode is operated in both forward and reverse bias and therefore both its forward and reverse characteristics are of great concern. In fact, as will be explained in detail presently, a step recovery diode performs its special function while transitioning from forward to reverse bias. A step recovery diode should display a large diffusion capacitance when in forward bias, a small depletion capacitance when in reverse bias, and a rapid transition therebetween.

More particularly, the intrinsic region of a step recovery diode must generally be made of a semiconductor material which is characterized by a long minority carrier lifetime (at least several nanoseconds) so as to maximize the storage of charge when in forward bias and thereby provide as large a diffusion capacitance as possible. Also, the intrinsic region must be very thin, typically less than about 10,000 Å, and the junctions between the intrinsic region and the other regions must be characterized by abrupt doping profiles (transition widths less than about 300 Å) to provide abrupt carrier confinement at the junctions, both of which tend to ensure a rapid transition between forward and reverse bias. Compromises must be made, for example between configuring the diode structure so as to maximize the speed of transition or to maximize the reverse diode breakdown voltage, to achieve the best overall performance in a given circuit.

Note: 10,000 Å (Angstroms)=1 micron (micrometer). For convenience, unless otherwise indicated all dimensions herein are expressed in Angstroms.

Light generating and detecting diodes together comprise another popular adaptation of the general PIN diode structure. The design constraints to which these diodes are subject are so fundamentally different from the constraints applicable to other diodes, especially step recovery diodes, that design principles and improvements which may be very useful when applied to light generating and emitting diodes often have little or no pertinence to the design of step recovery diodes, and vice versa.

For example, the design of light detecting diodes, also known as photodiodes, and light generating diodes, a category which includes light-emitting diodes (commonly known as LEDs) and laser diodes, is constrained by optical as well as electrical requirements, resulting in important physical and structural differences between these and other diodes. In constrast, a step recovery diode does not perform an optical function and hence most optical properties of semiconductor materials and structures that are critical to the design of light generating and detecting diodes are of but little concern to a designer of a step recovery diode.

Also, photodiodes and light generating diodes are always operated in only one mode. A light generating diode is operated only in forward bias for carrier injection to produce light. A photodiode is operated only in reverse bias so that photogenerated charge carriers are quickly swept out of the photosensitive region.

In addition, the intrinsic region of a photodiode is the photosensitive part and is usually thicker than the absorption length of the incident photons so as to make the device as sensitive as possible. In some applications sensitivity is sacrificed for increased speed, in which case the intrinsic region may be as thin as about 10,000 Å. However, even though a high-speed photodiode may have an intrinsic region as thin as the intrinsic region of a step recovery diode, photodiodes and step recovery diodes are distinct devices and are constructed differently. A photodiode would not function effectively as a step recovery diode and most design criteria for photodiodes are not useful in designing step recovery diodes.

The operation of a step recovery diode will now be explained, and differences between the capacitance characteristics of step recovery diodes and those of other diodes will be considered. In abstract terms, a step recovery diode may be viewed as a practical realization of an ideal nonlinear capacitor. An ideal nonlinear capacitor would have a relatively large capacitance when forward biased and a relatively small capacitance when reverse biased. The capacitance-voltage (C-V) characteristic of such a device is illustrated in FIG. 1.

A step recovery diode is characterized by abrupt junctions between adjacent regions. As noted above, an "abrupt" junction is any junction that is less than about 300 Å thick; typically such a junction is about 100 Å thick. A junction between adjacent regions of chemically similar materials is referred to herein as a "homojunction" whereas a junction between adjacent regions of chemically dissimilar materials is referred to as a "heterojunction".

A typical example of a homojunction step recovery diode according to the prior art is shown in schematic cross-section in FIG. 2. In a silicon-based embodiment, a $p^+$ region 21 on the order of 5,000 Å thick has a dopant concentration of about $10^{20}$ cm$^{-3}$ to $10^{22}$ cm$^{-3}$. An i (intrinsic) region 22 is less than about 10,000 Å thick. An n+ region 23 on the order of 5,000 Å thick has a dopant concentration of greater than about $10^{18}$ cm$^{-3}$. The p+ and n+ regions are as heavily doped as possible in order to minimize minority carrier injection into these regions.

Under forward bias, the junction between the p+ and i regions and the junction between the i and n+ regions are forward biased. A forward bias is applied by connecting a positive terminal of a voltage source to the p region and a negative terminal of the voltage source to the n region. This results in diffusion—that is, injection of relatively large concentrations of holes (positive charge carriers) from the p+ region and electrons (negative charge carriers) from the n+ region (on the order of $10^{18}$ cm$^{-3}$) into the intrinsic region.

The high concentration of both types of charge carriers throughout the intrinsic region effectively stores both types of carriers in that region. This may be considered as equivalent to charging a capacitor; the higher the concentration of carriers in the intrinsic region, the higher the capacitance of the diode. This capacitance occurs as a result of diffusion of charge carriers under forward bias and therefore is referred to as forward bias or "diffusion" capacitance.

Applying a reverse bias draws the charge carriers out of the intrinsic region; specifically, the holes are drawn back into the p+ region and the electrons are drawn back into the n+ region, thereby depleting the intrinsic region of mobile charge carriers. After the carriers have been removed from the intrinsic region, there is practically no current flow. Thus, under reverse bias, the diode may be considered as behaving much like a parallel plate capacitor having a spacing between the plates substantially equal to the thickness of the intrinsic region. This capacitance occurs as a result of depletion of charge carriers from the intrinsic region and is referred to as reverse bias or "depletion" capacitance. The depletion capacitance is substantially smaller than the diffusion capacitance.

Both the depletion capacitance and the diffusion capacitance are important characteristics of a step recovery diode. Optimum performance is achieved when the diffusion capacitance is large, the depletion capacitance is small, and the time to make the transition from diffusion to depletion capacitance is as small as possible. These requirements are such that generally a compromise must be made. Maximizing diffusion capacitance, for example, results in non-optimum transition time and depletion capacitance.

In contrast, in a photodiode the depletion capacitance must be minimized but the diffusion capacitance is not of great importance because in normal operation the device is never operated in forward bias; the designer is therefore free to configure the structure so as to minimize the depletion capacitance without concern for the diffusion capacitance. In a light generating diode the diffusion capacitance must be minimized to facilitate high speed modulation but the depletion capacitance is not of concern because the device is not operated in reverse bias, and the designer again is free to concentrate on structuring the device in a way that will optimize the important capacitance characteristic without having to temper the design according to a conflicting need to also optimize the other capacitance characteristic.

The operation of a step recovery diode as a step generator will now be described with reference to FIGS. 3A and 3B. A forward bias is applied to a step recovery diode 31 by a bias voltage source 32 having a positive terminal connected to an anode 313 (p+ region) of the diode 31 through a common return 33 and a negative terminal connected to a cathode 314 (n+ region) of the diode through a current-limiting resistor 310. This forward bias results in a steady-state current $i_d$ flowing through the diode.

An input voltage $E_{in}$ is applied to the diode by a step voltage source 34 having a negative terminal connected to the anode through the common return 33 and a positive terminal connected to the cathode through a DC blocking capacitor 37. The voltage source 34 is depicted as an ideal voltage source 35 and a standard source impedance 36 of 50 ohms. The generator circuit provides an output voltage $E_{out}$ at an output port 311 through a DC blocking capacitor 38. A load across the output is represented by a resistor 312.

Prior to time $t_1$, the input voltage $E_{in}$ is zero. A steady-state DC voltage provided by the bias source appears across the diode but is blocked by the capacitor 38 and therefore the output voltage $E_{out}$ is also zero.

At time $t_1$ the input voltage $E_{in}$ begins to change from zero to a positive value, counteracting the forward bias voltage from the source 32 and thereby reverse biasing the diode. In other words, as the voltage $E_{in}$ begins to develop across the diode, there is a build-up of an electric field in the intrinsic region 22. This switches the current $i_d$ from a forward current to a reverse current. In an ordinary diode there is little or no stored charge; therefore, the reverse current would be negligibly small and the reverse bias voltage would immediately appear across the diode, causing the output voltage $E_{out}$ to closely track the input voltage $E_{in}$. (The reverse current is due to thermally generated electron-hole pairs in the intrinsic region; that is, this current is space-charge limited).

But as discussed above, the build-up of the electric field across the intrinsic region of the step recovery diode produces a drift of holes from the intrinsic region toward and into the p+ region 21 and a drift of electrons toward and into the n+ region 23. This flow of charge carriers makes the diode appear to have a relatively low impedance, much as if the diode were a large capacitor discharging a stored charge (this is the effect of the large diffusion capacitance characteristic of the diode). Thus, the effective impedance experienced by the voltage source 35 remains substantially constant at the value of the source impedance 36. This relatively high conductivity of the diode, due to the stored carriers in the intrinsic region, effectively short-circuits the output port 311 so that $E_{out}$ remains substantially zero until all of the stored charge has been removed from the intrinsic region.

The voltage across the diode remains essentially zero until nearly all of the stored charge has left the intrinsic region. Between times $t_2$ and $t_3$ the remaining charge carriers (the "tail end" of the stored charge) exit the intrinsic region, resulting in a sudden increase in the resistivity of the intrinsic region. The current flowing through the diode drops to a very small reverse current. This in turn produces a sharp step transition in the output voltage $E_{out}$. The time $t_R$ of the step transition of $E_{out}$ (the interval of time between $t_2$ and $t_3$) is much shorter than the time of the step transition in the applied step voltage $E_{in}$. This can be seen graphically by comparing the relatively long step transition of $E_{in}$ (most of the interval of time between $t_1$ and $t_2$) with the relatively short step transition $t_R$ of $E_{out}$.

The duration of the time between $t_1$ and $t_2$ is largely determined by the amount of stored charged which in turn is determined by the carrier lifetime and the magnitude of the forward bias current.

The duration of the step transition time $t_R$ depends both on the device structure and the external circuit with which it interacts. According to Moll et. al., "Physical Modeling of the Step Recovery Diode for Pulse and Harmonic Generation Circuits," *Proceedings of the IEEE*, Vol 57, No. 7, July 1969, pages 1250-1259, the duration of $t_R$ is governed by several factors including:

(i) the transit time $T_t$ of minority carriers through the intrinsic region ($T_t$ in turn is determined by the saturated drift velocity of the minority carriers through the intrinsic region and the thickness of the intrinsic region);

(ii) the RC time constant $T_{RC}$, where R is the parallel combination of the source impedance 36 and the load resistance 312 and C is the reverse bias of depletion capacitance of the diode (the current-limiting resistance 310 is much larger than the other resistances and therefore has a negligible effect on $T_{RC}$);

(iii) the amount of minority carrier diffusion into the p+ and n+ regions; and (iv) the abruptness of the doping profile gradings between the p+ and i regions and between the i and n+ regions.

Disregarding the third and fourth factors (minority carrier diffusion and non-abrupt doping profiles, both of which broaden the width of the tail end of the charge carrier distribution being swept out of the intrinsic region and therefore tend to increase the minimum achievable step transition time $t_R$), $t_R$ is given by $$t_R = (T_t^2 + T_{RC}^2)^{\frac{1}{2}}.$$

Most conventional step recovery diodes are fabricated on silicon using vapor phase epitaxy, ion beam implantation and diffusion techniques. The minority carrier lifetimes in the intrinsic region of a silicon-based step recovery diode are relatively long, typically longer than about five nanoseconds, resulting in a relatively high diffusion capacitance. However, a structure produced by these techniques typically exhibits an intrinsic region thickness greater than 5,000 Å and p+ to i and i to n+ dopant level transitions (profile gradings) greater than 2,500 Å. In addition, minority carriers diffuse from the intrinsic region into the p+ and n+ regions to a diffusion depth of as much as several microns depending on dopant concentration (this problem is depicted graphically in FIG. 4B, to be discussed presently). Both of these effects broaden the effective thickness of the intrinsic region, resulting in a minimum achievable step transition time $t_R$ of about 30 picoseconds (ps). The maximum output voltage achievable with such a device has been around 15 volts.

It has been proposed to increase the maximum output voltage that can be obtained from a step recovery diode by making the diode out of a semiconductor compound made of a group III material such as gallium and a group V material such as arsenic. However, simulation studies have shown that, in a gallium arsenide (GaAs) step recovery diode having charge carrier concentrations in the intrinsic region of magnitudes comparable to those found in a silicon step recovery diode, radiative recombination would limit the carrier lifetime to less than about three nanoseconds, thereby reducing the diffusion capacitance.

The problem with radiative recombination is explained as follows. If a positive and a negative charge carrier encounter one another, they combine, their respective electric charges neutralize each other, and both of them are thereupon considered as having ceased to exist. This process is referred to as "recombination". Radiative recombination is accompanied by emission of a burst of energy in the form of a photon; nonradiative recombination is not accompanied by the emission of a photon.

Nonradiative recombination occurs at comparable rates in both silicon and GaAs semiconductor material, but radiative recombination occurs at a much higher rate in GaAs than in silicon. Therefore, charge carriers tend to last longer in silicon than in GaAs.

In addition, photons that are emitted during radiative recombination in the intrinsic region tend to generate minority carriers in the adjacent p+ and n+ regions, thereby aggravating the problem of minority carrier diffusion into those regions.

FIGS. 4A–4D show simulation results for a hypothetical GaAs p+-i-n+ homojunction step recovery diode having a structure similar to the silicon diode shown in FIG. 2 but fabricated of GaAs. In particular, as best shown in FIG. 4B this hypothetical GaAs diode has a p+ region 41 analogous to the region 21 of FIG. 2, an i region 42 analogous to the region 22 of FIG. 2 and an n+ region 43 analogous to the region 23. More particularly, FIG. 4A is an energy band diagram of the GaAs diode at high forward bias $V_F = 1.4$ volts, FIG. 4B shows the charge carrier concentrations within the diode at this forward bias, FIG. 4C presents an energy band diagram of the same diode under a reverse bias of $V_R = -5$ volts, and FIG. 4D presents corresponding carrier concentrations.

The problem of minority carrier diffusion under forward bias is depicted graphically in FIG. 4B. A solid line 44 represents positive charge carriers at a high level in the p+ region 41, at a slightly lower level in the i region 42, and extending into the n+ region 43. Similarly a dashed line 45 depicts a large diffusion of minority negative carriers extending from the intrinsic region 42 into the p+ region 41.

These minority carrier diffusions increase the transition time $t_R$ of the diode with increasing forward bias because the minority carrier distributions extend an undesirably long distance into the n+ and p+ regions, increasing the effective thickness of the intrinsic region. As previously discussed, this increases the time needed to sweep out the forward bias stored charge, increasing the transition time. Therefore, both the n+ and p+ regions are doped to a level of about $10^{19}$ cm$^{-3}$, the highest concentrations possible, in order to minimize minority carrier diffusion.

FIG. 4B was developed as part of the simulation study of GaAs, but qualitatively the minority charge carrier diffusion that it depicts is similar to the minority charge carrier diffusion that occurs in silicon step recovery diodes under forward bias conditions.

From the foregoing it will be apparent that there remains a need for a practical step recovery diode that has a shorter step transition time than has been achievable and that can produce higher output voltages than have been attained.

SUMMARY OF THE INVENTION

The present invention provides a novel double heterostructure step recovery diode characterized by an exceptionally short step transition time. A step recovery diode according to the invention can provide a step voltage having a transition time of less than 10 picoseconds and a magnitude of more than 15 volts.

Briefly and in general terms, a double heterostructure step recovery diode according to the invention includes a charge storage region, a wide bandgap p-type region forming a heterojunction with the charge storage region, and a wide bandgap n-type region also forming a heterojunction with the charge storage region. The three regions together define a p$^+$-i-n$^+$ diode structure.

The p and n regions have wider bandgaps than the charge storage region. In fact, a "double heterostructure" diode is defined herein as a diode in which a charge storage region having a relatively narrow bandgap is bounded by p and n regions each having relatively wide bandgaps. The difference in bandgaps tends to reduce any diffusion of minority carriers into the p and n regions under forward bias conditions, thereby reducing the step transition time.

Application of a forward bias voltage across the diode results in an accumulation of charge carriers in the charge storage region and a low impedance through the diode. Switching the polarity of the voltage to a reverse bias results in sweeping the charge carriers out of the charge storage region, during which the impedance through the diode remains low, and then in step recovery (step transition) which takes place when substantially all of the charge carriers have been swept out of the charge storage region. The impedance abruptly increases to a very high level during step recovery.

In a preferred embodiment the charge storage region comprises an intrinsic region, which as discussed previously means a relatively undoped region. The intrinsic region is preferably very thin, less than about 5,000 Å, thereby reducing the transit time of minority charge carriers therethrough.

Preferably, a p-type contact region adjoins the wide bandgap p region and an n-type contact region adjoins the wide bandgap n region. These contact regions have narrower bandgaps than the wide bandgap regions. A heterojunction is formed between the wide bandgap p region and the contact p region, and another heterojunction is formed between the wide bandgap n region and the contact n region.

In one embodiment a graded bandgap region is located between the intrinsic region and one of the wide bandgap regions. This graded bandgap region provides a generally continuous gradation in bandgap between the relatively narrower bandgap of the intrinsic region and the relatively wider bandgap of the wide bandgap region. A graded bandgap region is preferably also located between the intrinsic region and the other wide bandgap region. These graded bandgap regions reduce the abruptness of the junctions that bound the wide bandgap regions, and they tend to minimize dipole layer formation between the wide bandgap regions and the intrinsic region; thus, whether they are used in a given device depends on whether making the junctions as abrupt as possible or mimimizing dipole formation is considered to be the more important.

A narrow bandgap p-type region is preferably located between the wide bandgap p region and the intrinsic region. Similarly a narrow bandgap n-type region is located between the wide bandgap n region and the intrinsic region. These narrow bandgap regions tend to prevent recombination of charge carriers as they enter the intrinsic region through the heterojunctions and thereby assure good carrier injection into the intrinsic region under forward bias conditions.

The narrow bandgap regions are relatively thinner than the wide bandgap regions. In fact, preferably they are thinner than a photon absorption length which is determined by the energy level of any photons that may be generated by radiative recombination in the intrinsic region. The bandgap of the intrinsic region determines the energy level of such photons, and this energy level in turn determines the absorption length. The wide bandgap regions are substantially transparent to photons having this energy level. As a result, any photons generated by radiative recombination in the intrinsic region tend to pass right through one of the narrow bandgap regions and into and through the corresponding wide bandgap region without generating significant numbers of minority carriers in either said region. "Significant numbers" in this context means a quantity of minority carriers that would adversely affect the step recovery.

In one preferred embodiment the intrinsic region is made of gallium arsenide and the wide bandgap regions are made of a compound of aluminum, gallium and arsenic characterized as $Al_xGa_{1-x}As$, where x is typically between about 0.1 and 0.4. In an alternate embodiment the intrinsic region is made of a compound of indium, gallium, arsenic and phosphorus characterized as InGaAsP and the wide bandgap regions are made of a compound of indium and phosphorus. In another alternative, the intrinsic region is made of a compound of germanium and silicon characterized as $Ge_xSi_{1-x}$, where x is between about 0.1 and 0.3, and the wide bandgap regions are made of silicon. This latter version is preferably fabricated on a sapphire substrate.

A further improvement in performance is achieved by embedding the diode in undoped wide bandgap material to reduce surface recombination of charge carriers adjacent exposed surfaces of the intrinsic region. For example, in the embodiment in which the intrinsic region is made of gallium arsenide, undoped AlGaAs is deposited around the intrinsic and p regions.

In another embodiment, a still further improvement in step transition time is obtained by reducing a "slow tail" portion of the step recovery. "Slow tail" refers to a portion of the step recovery during which a small number of charge carriers are still in the charge storage region and during which the impedance of the diode increases relatively slowly. In one version, the charge storage region is made of p-type material having a doping level less than that of the wide bandgap p region. This p-type dopant urges charge carriers out of the charge storage region under reverse bias conditions, thereby minimizing the duration of any slow tail portion of the step recovery.

In another version the charge storage region includes means for generating a built-in electric field. As used herein, "built-in" means arising by virtue of the structure of the material as opposed to arising from an applied bias voltage or other electric potential. The electric field urges charge carriers out of the charge storage region under reverse bias conditions and tends to confine positive charge carriers (holes) closer to the wide bandgap p region. This field is preferably generated in the charge storage region by a doping gradation, a bandgap gradation, or the like.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 1 illustrates the capacitance-voltage characteristic of a conventional step recovery diode.

FIG. 2 is a schematic cross section of the structure of a conventional silicon step recovery diode.

FIG. 4B is a simulated diagram of electron and hole concentrations in a homojunction GaAs diode under reverse bias.

FIG. 6B shows electron and hole concentrations in the diode of FIG. 5 under zero bias.

FIG. 8B shows electron and hole concentrations in the diode of FIG. 5 under reverse bias.

FIG. 13 illustrates an alternate embodiment of a step recovery diode similar to the one shown in FIG. 5 but in which the charge storage region is made of lightly doped p-type material.

FIG. 14 illustrates an alternate embodiment of a step recovery diode similar to the one shown in FIG. 13 in which the charge storage region is characterized by a gradation in doping level.

FIG. 20 illustrates an alternate embodiment of a step recovery diode similar to the one shown in FIG. 5 but made of compounds of indium and phosphorus.

DETAILED DESCRIPTION OF THE INVENTION

Figure 3A:
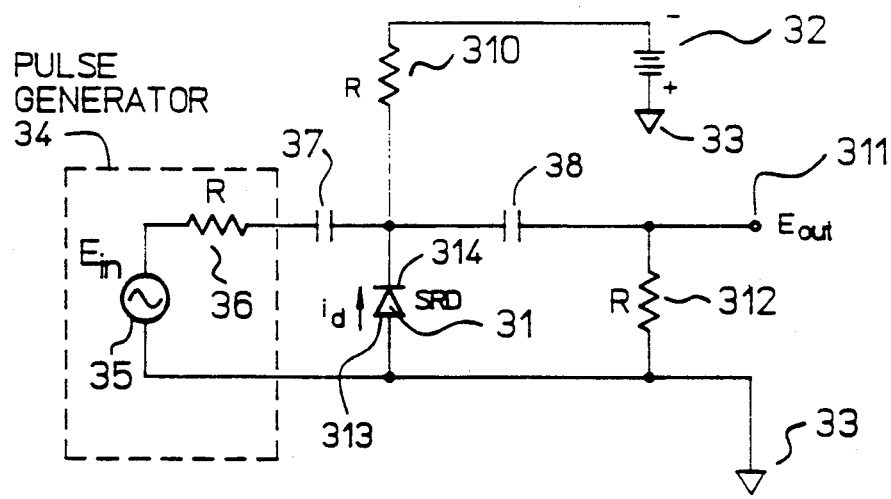
FIG. 3A shows a conventional step recovery diode in a pulse generator circuit.
Figure 3B:
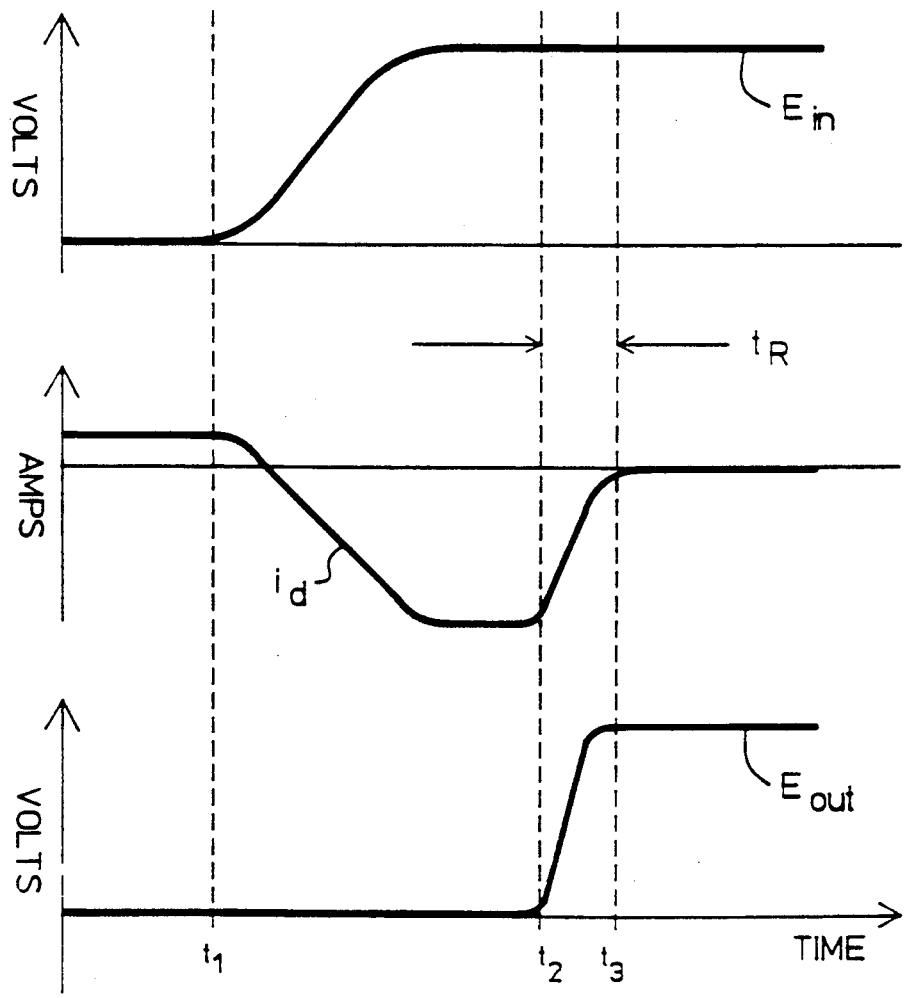
FIG. 3B shows an input voltage provided by the pulse generator of FIG. 3A and the resulting diode current and output voltage as functions of time.
Figure 4A:
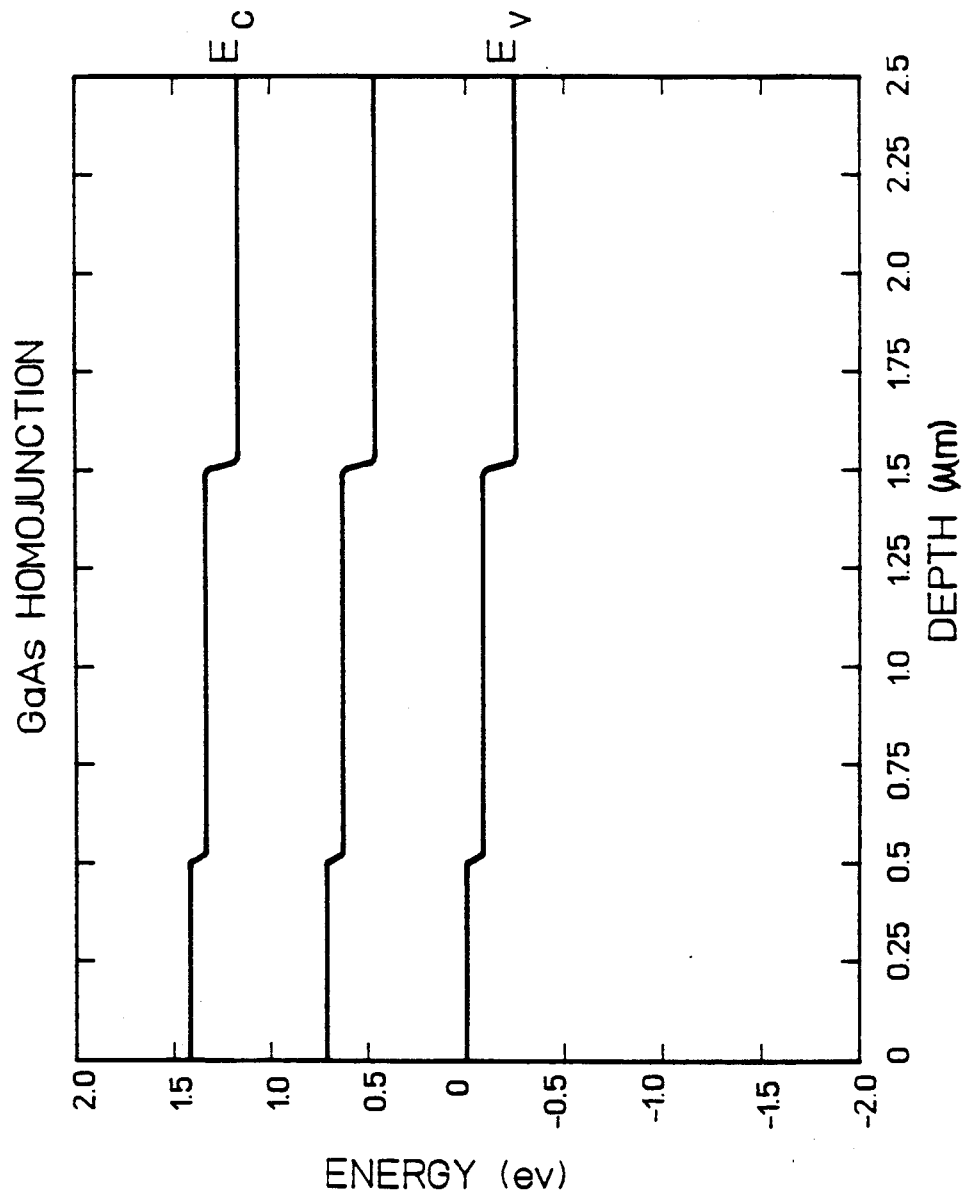
FIG. 4A is a simulated energy band diagram of a homojunction GaAs step recovery diode under forward bias.
Figure 4B:
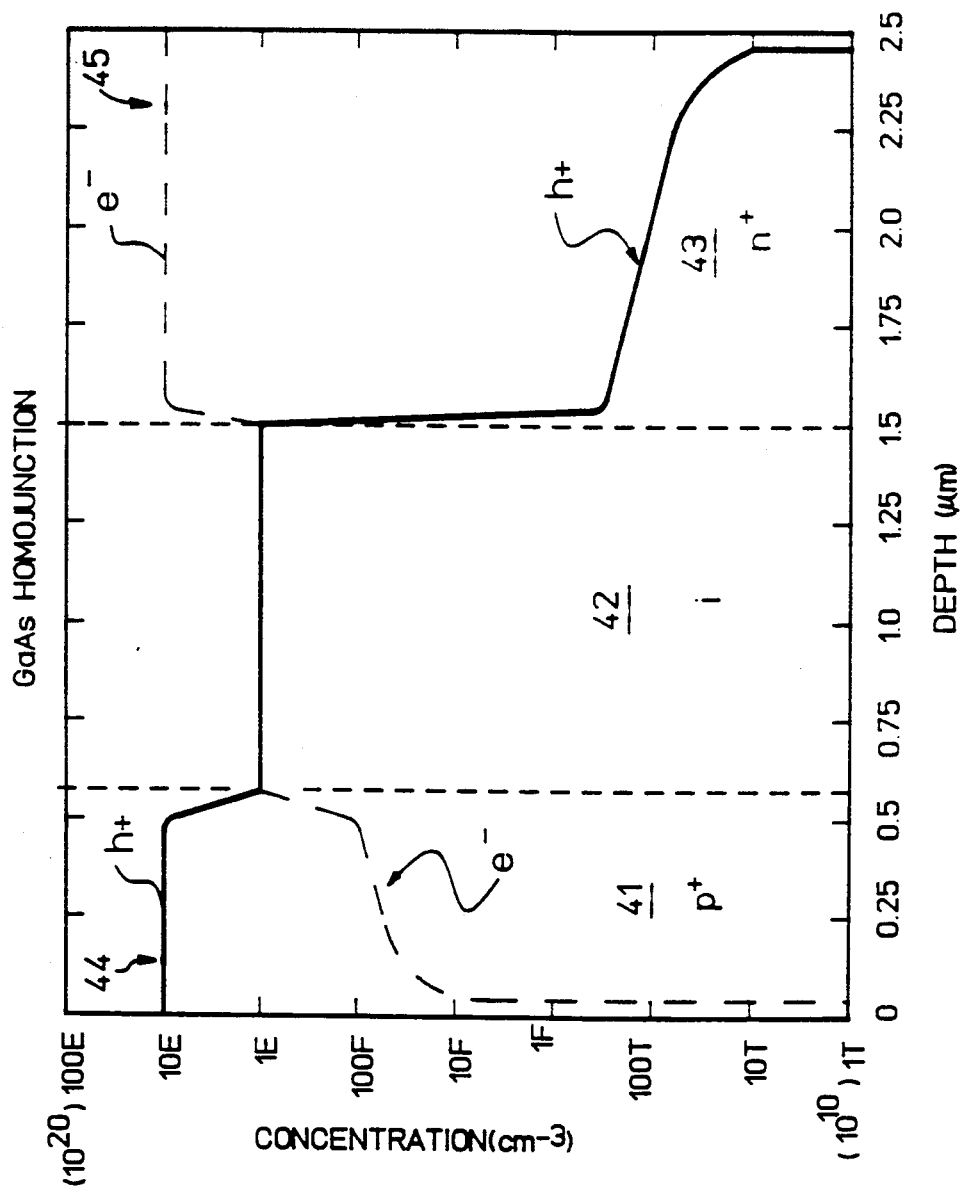
FIG. 4B is a simulated diagram of electron and hole concentrations in a homojunction GaAs diode under forward bias.
Figure 4C:
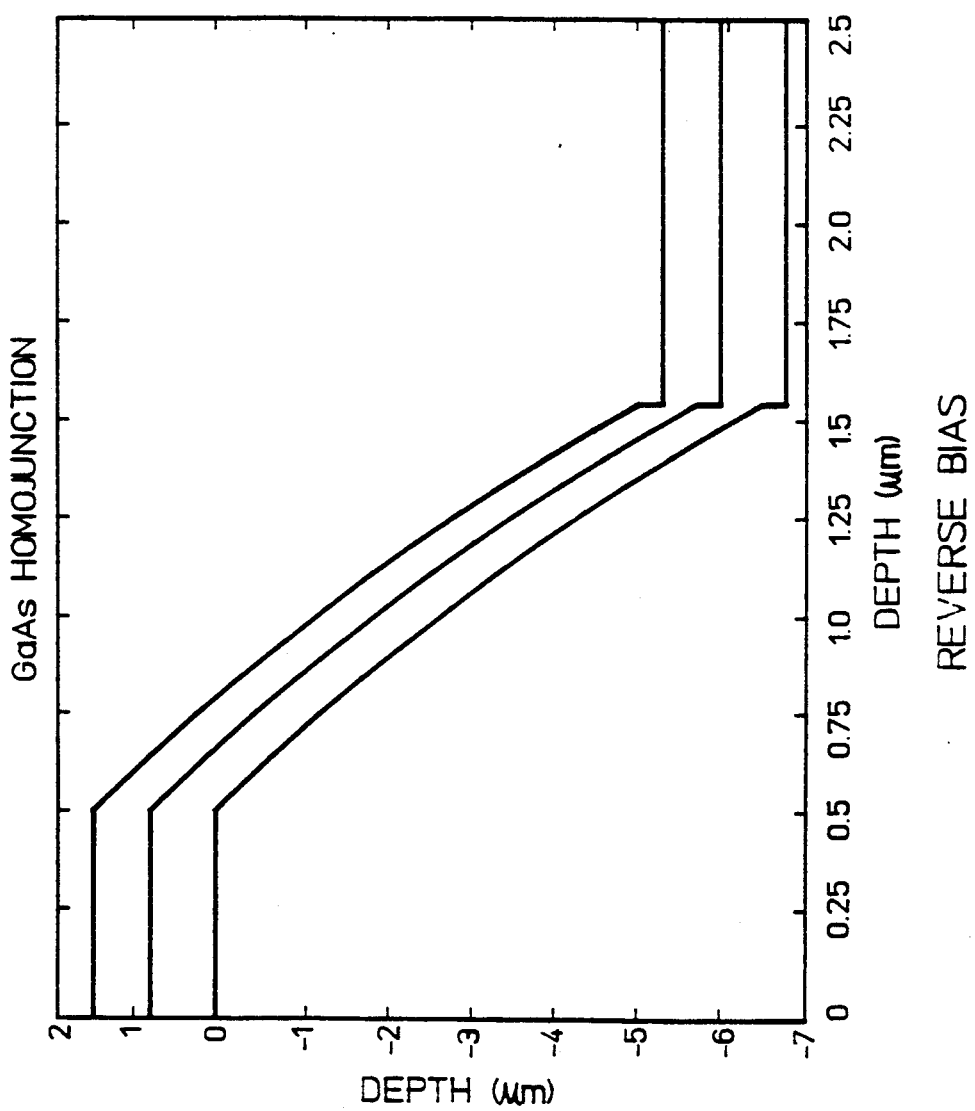
FIG. 4C is a simulated energy band diagram of a homojunction GaAs step recovery diode under reverse bias.
Figure 4D:
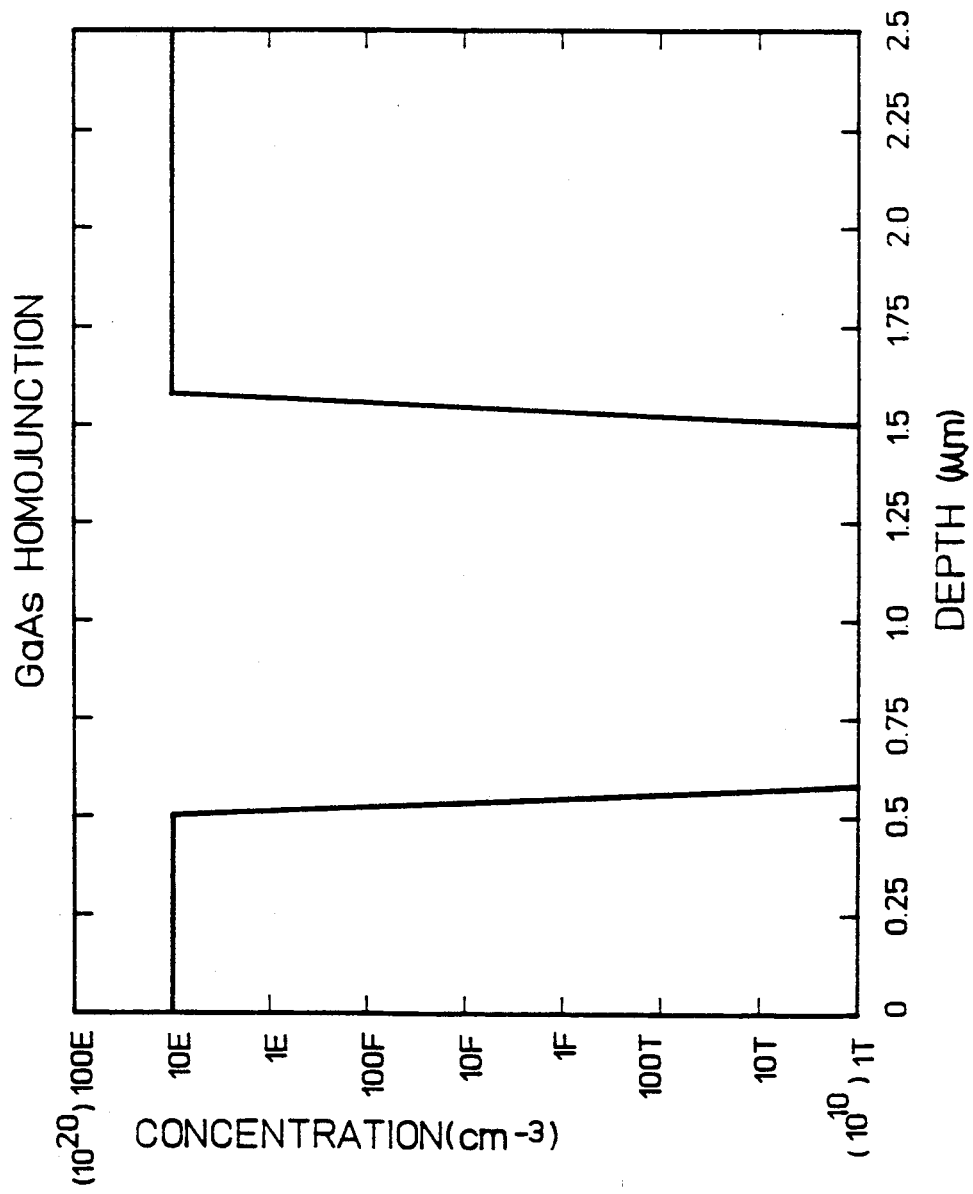

As shown in the drawings for purposes of illustration, the invention is embodied in a novel double heterostructure step recovery diode having a middle region of relatively narrow bandgap between p and n regions of relatively wide bandgap.

Existing step recovery diodes have achieved step transition times as fast as about 30 picoseconds and output voltages of about 15 volts. These values have been limited by such factors as (i) the time required for minority carriers to transit the intrinsic region of the diode, (ii) a time constant that is proportional to the depletion capacitance of the diode, (iii) minority carrier injection into the n and p regions, and (iv) the abruptness of the doping gradation between the intrinsic region and the n and p regions.

In accordance with the invention, a double heterostructure step recovery diode includes a narrow bandgap charge storage region, a wide bandgap p region forming a heterojunction therewith, and a wide bandgap n region also forming a heterojunction therewith, the three regions together defining a p+-i-n+ diode structure. A step recovery diode according to this structure provides a step transition time of less than 10 picoseconds at an output level higher than 15 volts.

Figure 5:
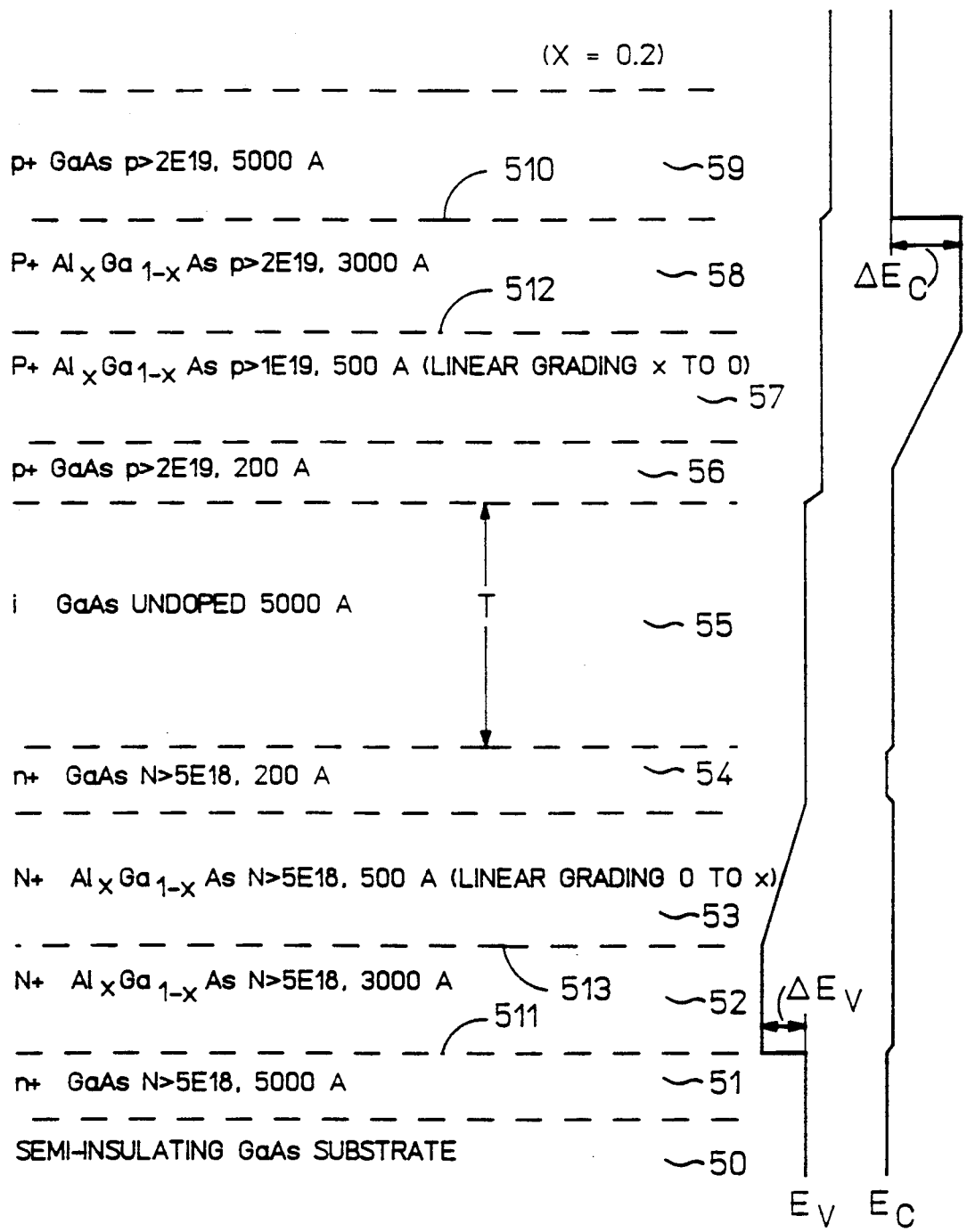
FIG. 5 illustrates the structure of a preferred embodiment of a double heterostructure step recovery diode according to the present invention.

In a first preferred embodiment, a double heterojunction step recovery diode according to the invention comprises a charge storage region 55, a wide bandgap p-type region 58 having a wider bandgap than the charge storage region and forming a heterojunction 512 therewith, and a wide bandgap n-type region 52 having a wider bandgap than the charge storage region and forming a heterojunction 513 therewith, as shown in FIG. 5.

For convenience, the first digit of a two or three digit reference numeral, and the first two digits of a four digit reference numeral, indicate the figure number in which that reference numeral is first used.

The three regions 58, 55 and 52 together define a PIN diode structure, the p and n regions characterized by a wider bandgap than the charge storage region. The junctions 512 and 513 are sufficiently abrupt to produce a rate of spatial variation of concentration of stored charge in the charge storage region that is larger adjacent the junctions than elsewhere.

In this embodiment, the charge storage region 55 comprises intrinsic material. Such material generally has an impurity level of less than about $10^{15}$ cm$^{-3}$.

Preferably the diode includes a p-type contact region 59 having a narrower bandgap than the wide bandgap p region 58 and forming a heterojunction 510 therewith, and an n-type contact region 51 having a narrower bandgap than the wide bandgap n region 52 and forming a heterojunction 511 therewith.

One embodiment includes a graded bandgap region such as a p-type region 57 between the intrinsic region 55 and the wide bandgap p region 58 or an n-type region 53 between the intrinsic region 55 and the wide bandgap n region 52. A graded bandgap region is characterized by a generally continuous gradation in bandgap between the bandgap of the intrinsic region and that of the wide bandgap region.

Another embodiment includes a narrow bandgap p-type region 56 between the intrinsic region 55 and the wide bandgap p region 58 and a narrow bandgap n-type region 54 between the intrinsic region and the wide bandgap n region 52.

The structure of the diode shown in FIG. 5 may be represented as a

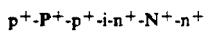

device, where the superscript "+" indicates a relatively high doping level, generally produced by dopant concentrations on the order of about $10^{17}$ cm$^{-3}$ or more; a lower case letter p or n indicates a narrow bandgap material; and an upper case letter P or N indicates a wide bandgap material.

In the embodiment shown in FIG. 5, the intrinsic region 55 comprises undoped gallium arsenide. The narrow bandgap p region 56 comprises gallium arsenide highly doped to a level on the order of $10^{19}$ cm$^{-3}$, and the narrow bandgap n region 54 comprises gallium arsenide highly doped to a level on the order of $10^{18}$ cm$^{-3}$. The wide bandgap regions 58 and 52, and the graded bandgap regions 57 and 53 if used, comprise a compound of aluminum, gallium and arsenic characterized as $Al_xGa_{1-x}As$. The quantity x, which can have a value between about 0.1 and 0.4, has a value of 0.3. The p-type regions 58 and 57 are doped to a level on the order of $10^{19}$ cm$^{-3}$ and the n-type regions 52 and 53 are doped to a level on the order of $10^{18}$ cm$^{-3}$. The contact regions 59 and 51 comprise gallium arsenide doped to levels of about $10^{19}$ cm$^{-3}$ and $10^{18}$ cm$^{-3}$ in the p and n regions, respectively.

The graded bandgap p region 57 comprises a compound of aluminum, gallium and arsenic similar to the compound of which the wide bandgap p region 58 is made. The graded region 57 may be expressed as $Al_yGa_{1-y}As$, wherein the value of y varies between the same value as x at the junction 512 between the graded region 57 and the wide bandgap region 58, and zero at its opposite boundary.

The structure shown in FIG. 5 can be produced by any of several techniques, among them Molecular Beam Epitaxy (MBE), Chemical Beam Epitaxy (CBE), Organo-Metallic Vapor Phase Epitaxy (OMVPE) and Limited Reaction Process (LRP), all known in the art. There are many choices of dopants including silicon, tellurium, and tin for n-type dopants and beryllium and carbon for p-type dopants.

The intrinsic region 55 is less than about 5,000 Angstroms thick. The wide bandgap regions 58 and 52 are each about 3,000 Angstroms thick. The p-type contact region 59 is about 5,000 Angstroms thick and the n-type contact region 51 may be even thicker; in the embodiment of FIG. 5 it is over 10,000 Angstroms thick. The narrow bandgap regions 56 and 54 are typically very thin, preferably about 200 Angstroms. The graded bandgap regions 57 and 53 are each about 500 Angstroms thick.

The contact regions 51 and 59 facilitate the formation of good ohmic contacts to metallic connectors. In the embodiment shown, the n-type contact region 51 provides an ohmic contact on a semi-insulating n+ gallium arsenide substrate 50. Various physical structures for forming metal contacts in physical contact with the regions 51 and 59 are well known and will not be further discussed herein.

The graded bandgap regions 53 and 57 minimize dipole layer formation between the regions 52 and 54 and between the regions 56 and 58, respectively. In other embodiments, the graded bandgap regions 53 and 57 are omitted to make the junctions between the wide bandgap regions 58 and 52 and the intrinsic region 55 as abrupt as possible.

The narrow bandgap regions 54 and 56 provide good transitions between the wide bandgap regions 52 and 58 and the intrinsic region 55. Omission of these regions 54 and 56 may result in poor carrier injection into the intrinsic region due to recombination at the heterojunction interface. This recombination is caused by interface states produced by defects normally present at a heterojunction.

The regions 54 and 56 also compensate for relatively lower free carrier concentrations in the wide bandgap regions. See, for example, the discussion in Casey and Panish, *Heterostructure Lasers Part A: Fundamental Principles*, Chapter 4, or Technical Memo 85-HDL-11 published by the research laboratories of the Hewlett-Packard Company, Palo Alto, Calif. This lower free carrier concentration results from a higher donor activation energy in n-type $Al_xGa_{1-x}As$ than that existing in the narrower bandgap GaAs.

The wide bandgap regions 58 and 52 present potential barriers for both holes and electrons injected into the intrinsic region 55. These barriers help to confine minority carriers to the intrinsic region 55 and thereby reduce any diffusion of minority carriers from the intrinsic region into the p and n regions of the diode; specifically, the wide bandgap quality of the p region 58 reduces diffusion of minority electrons into the p region 58, and the wide bandgap quality of the n region 52 reduces diffusion of minority holes into the n region 52.

More particularly, the level of injected minority electron diffusion into the wide bandgap p region 58 is reduced by a factor of $\exp-\Delta E_C/kT$ where $\Delta E_C$ is the conduction band discontinuity experienced in going from the narrower to the wider band gap material. Similarly, the level of injected minority hole diffusion into the wide bandgap n region is reduced by a factor of $\exp-\Delta E_V/kT$ where $\Delta E_V$ is the valence band discontinuity experienced in going from the narrower to the wider bandgap material. For a more detailed discussion of this, see Casey and Panish, *Heterostructure Lasers Part A: Fundamental Principles*, Chapter 4.

The narrow bandgap regions 54 and 56 are preferably thinner than a predetermined absorption length for photons, specifically photons that may be generated by radiative recombination in the intrinsic region. This absorption length is determined by the energy level of the photons, and this energy level in turn is a function of the bandgap of the intrinsic region. The wide bandgap regions are transparent to photons having this energy level. As a result, any photons generated by radiative recombination in the intrinsic region and entering one of the narrow bandgap regions tend to pass through the narrow bandgap region and into and through the wide bandgap region without generating significant numbers of minority carriers in those regions.

More specifically, the transparency of the wide bandgap regions 58 and 52 reduces any adverse effects of photogenerated carriers that may be produced in a direct bandgap material such as the gallium arsenide intrinsic region 55. In the wide bandgap regions, the bandgap is larger than the energy of any photons generated by electron-hole pair recombination in the narrow bandgap intrinsic region 55 and therefore the wide band gap regions are transparent to such photons. The narrow bandgap p and n regions 56 and 54 each have a thickness less than the absorption length of that region for photons generated by charge carrier recombination within the intrinsic region. Therefore, absorption of such recombination generated photons tends not to occur either in the narrow bandgap regions or in the wide bandgap regions, and any such photons pass through to the p and n contact regions 59 and 51.

The wide bandgap regions provide potential barriers that prevent any carriers generated by photons in the contact regions from diffusing back to the intrinsic region. This confinement of photon generated carriers to the contact regions causes the carriers to recombine either nonradiatively or radiatively in the contact regions. If they recombine radiatively, a secondary photon is generated and then reabsorbed. The number of secondary photons is much smaller than the number of primary photons because the product of the electron and hole concentrations in the contact regions is much smaller than in the intrinsic region under forward bias conditions.

Figure 6A:
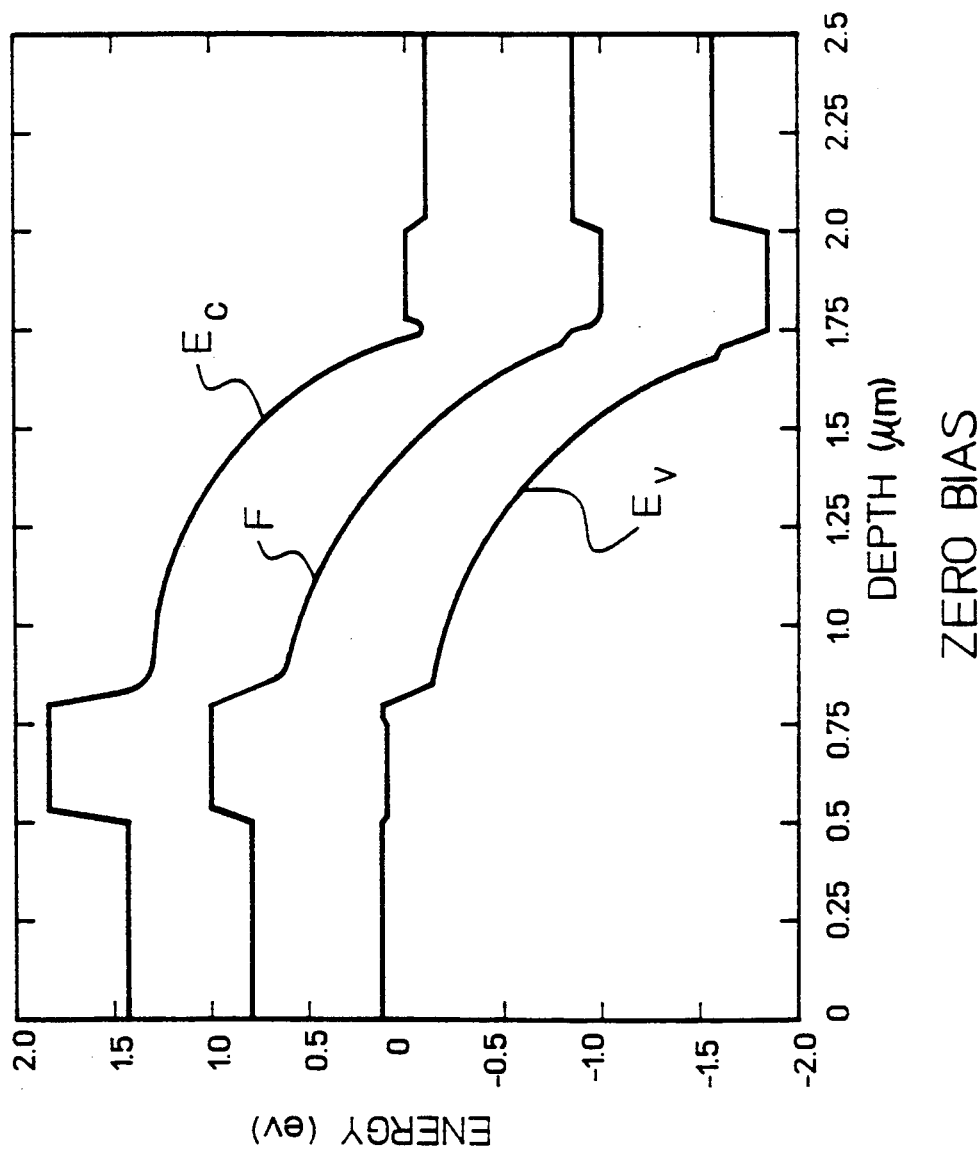
FIG. 6A is an energy band diagram of the diode of FIG. 5 under zero bias.
Figure 7A:
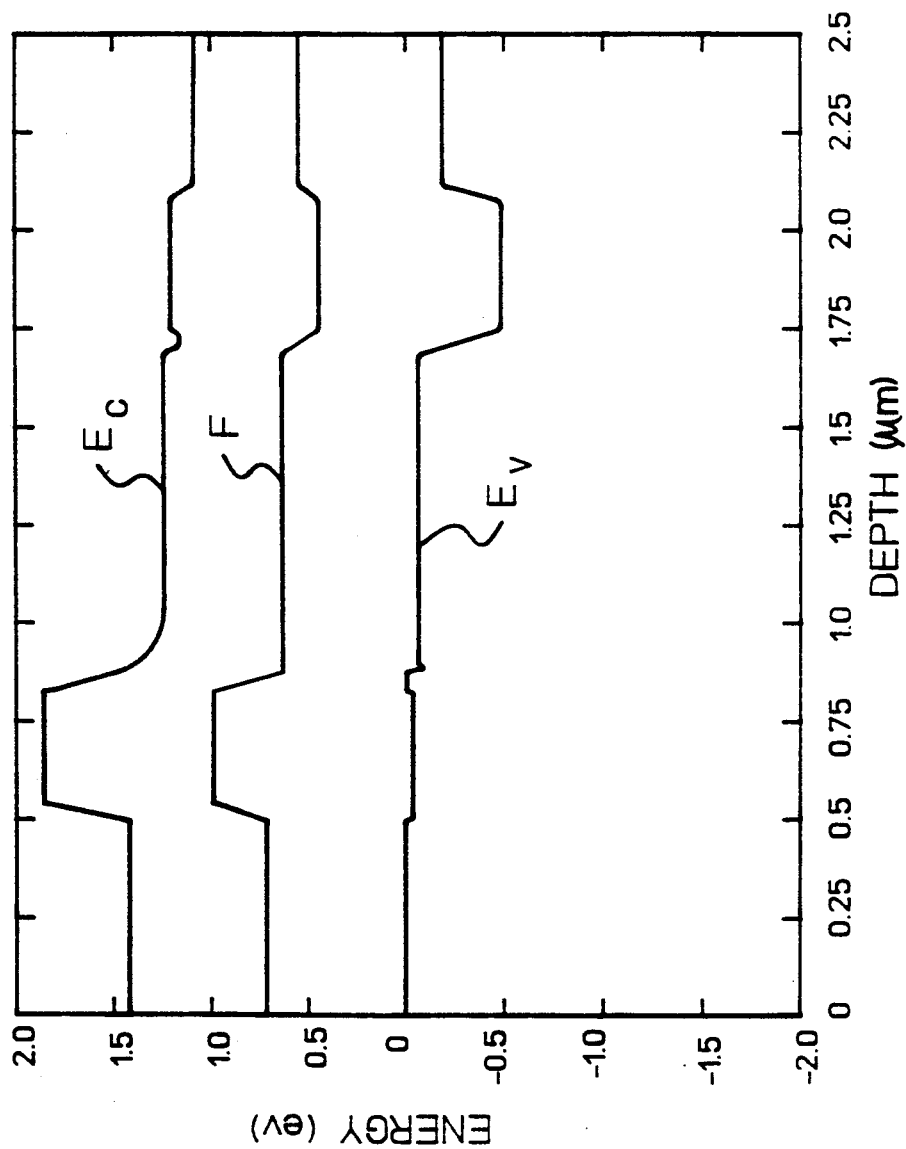
FIG. 7A is an energy band diagram of the diode of FIG. 5 under forward bias.
Figure 7B:
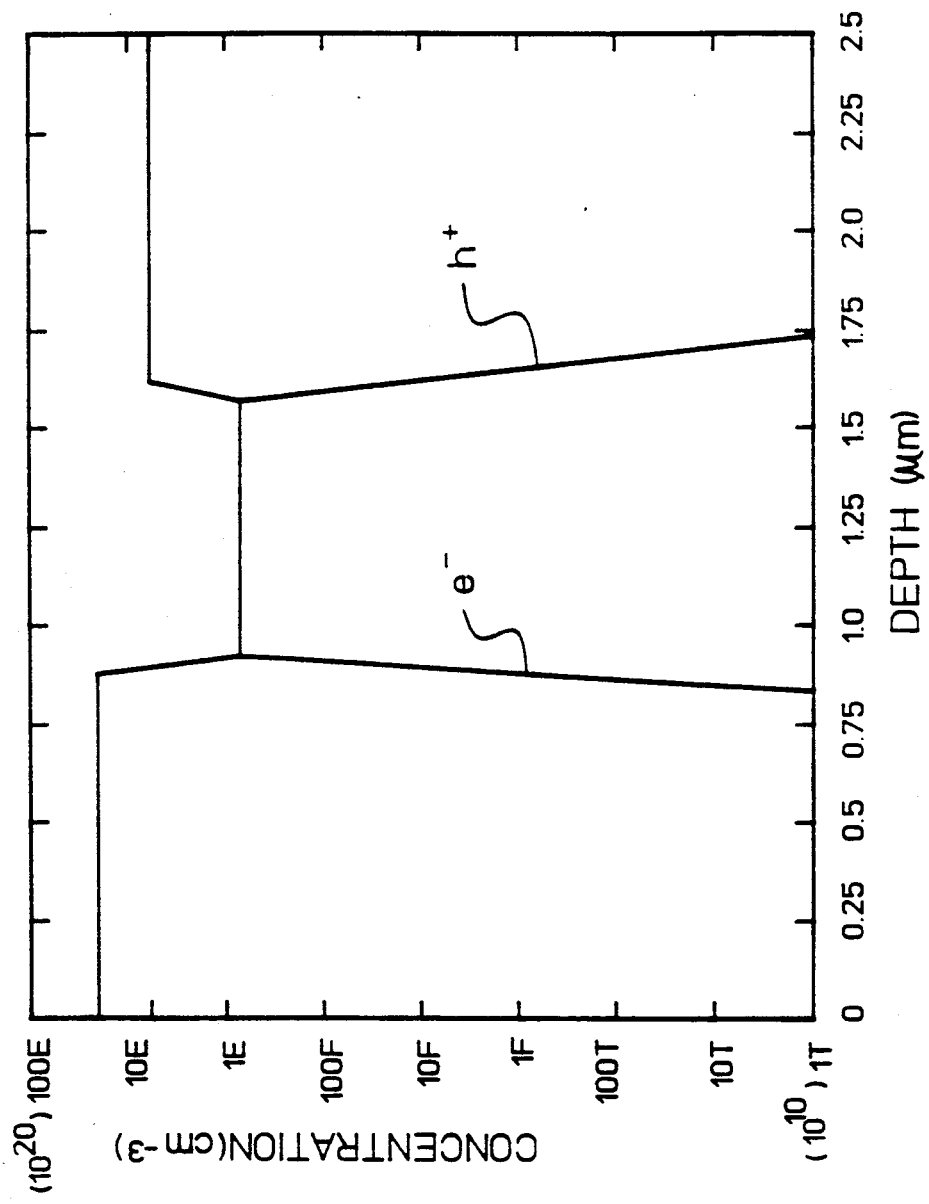
FIG. 7B shows electron and hole concentrations in the diode of FIG. 5 under forward bias.
Figure 8A:
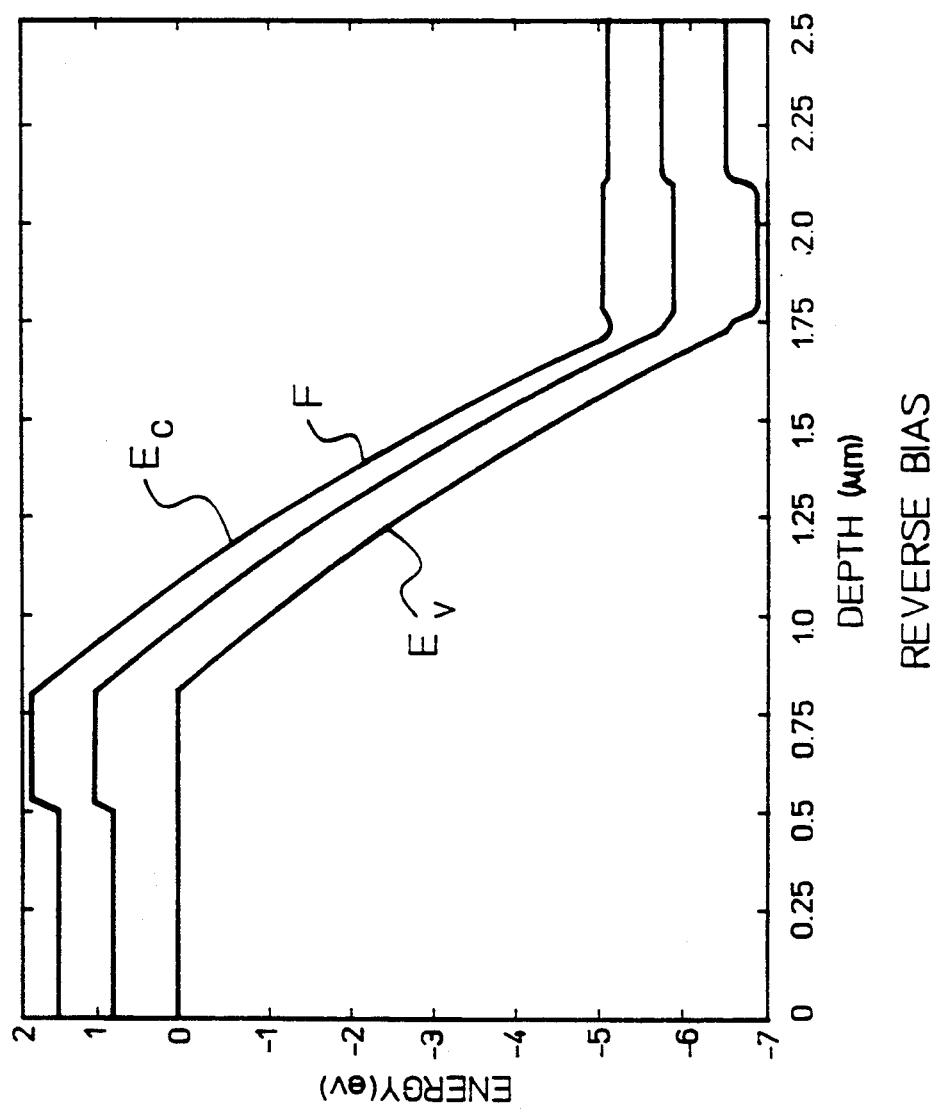
FIG. 8A is an energy band diagram of the diode of FIG. 5 under reverse bias.

FIGS. 6A, 7A and 8A show simulation results of the energy band diagrams of the double heterostructure step recovery diode of FIG. 5 under zero bias, 1.4 volt forward bias and 5 volt reverse bias, respectively. FIGS. 6B, 7B and 8B show simulation results of the electron and hole concentration diagrams of the diode under zero bias, 1.4 volt forward bias and 5 volt reverse bias, respectively. These figures show that the p+-P+-i structure acts as a good potential barrier to injection of electrons from the intrinsic region into the p+ contact region and that the i-N+-n+ structure acts as a good potential barrier to injection of holes from the intrinsic region into the n+ contact region. In particular, FIG. 7B shows that there is good minority carrier confinement to the intrinsic region under forward bias conditions.

FIG. 7B also shows that there is a decrease of several orders of magnitude in minority carrier injection into the wide bandgap regions from the intrinsic region as compared with the minority carrier injection into the n and p regions in the conventional silicon step recovery diode shown in FIG. 2. This decrease is equal to $\exp-\Delta E_C/kT$ for the region 58, where $\Delta E_C$ is the band gap discontinuity at the heterojunction interface 510. Similarly, this decrease is equal to $\exp-\Delta E_V/kT$ for the region 52, where $\Delta E_V$ is the bandgap discontinuity at the heterojunction interface 511. This shows that the wide bandgap regions limit minority carrier injection from the intrinsic region 55 into the contact regions, thereby producing a transition time primarily determined by the thickness of the intrinsic region.

As discussed above, the dominant recombination mechanism experienced by electron-hole pairs in the intrinsic region of a gallium arsenide diode is radiative. That is, electron-hole pairs predominantly recombine to generate photons with energies close to the bandgap energy. Some of these photons are reabsorbed, thereby generating electron-hole pairs elsewhere in the semiconductor. See, for example, Dumke, "Spontaneous Radiative Recombination in Semiconductors," *Physical Review*, Vol 105, No. 1, January 1957. Cladding the intrinsic region with wider bandgap material that is transparent to the bandgap radiation according to the invention effectively separates the photon generated minority carriers from the intrinsic region.

Other materials can be selected to form a double heterojunction step recovery diode according to the invention. These materials include other III-V material systems and II-VI material systems. A particularly suitable material system is the Si/Ge$_x$Si$_{1-x}$/Si material system wherein the intrinsic region comprises a compound of germanium and silicon characterized as Ge$_x$Si$_{1-x}$ and the wide bandgap regions comprise silicon. The value of x in this compound is preferably about 0.3. The device is preferably fabricated on a sapphire substrate. The general structure of a step recovery diode fabricated in this material system is similar to the structure of the diode as shown in FIG. 5 and discussed above and therefore is not separately illustrated.

This silicon and germanium material system offers certain advantages over III-V material systems in respect of double heterostructure step recovery diodes. Among these advantages are the following:

1) this system exhibits an indirect bandgap, resulting in an increased minority carrier lifetime which in turn increases the forward bias capacitance of the diode;

2) only nonradiative recombination mechanisms are important, with the result that photon generation and self-absorption are not significant;

3) silicon is easily passivated by oxidizing the top surface to produce a silicon dioxide passivation region that significantly reduces any surface recombination; and 4) higher doping densities for both n-type and p-type materials are possible.

A disadvantage of the silicon and germanium system is a lattice mismatch (pseudo morphic) between the silicon and and the Ge$_x$Si$_{1-x}$ compound. This generally limits the thickness of the intrinsic region to a few thousand Angstroms and can also reduce the minority carrier lifetime.

Another advantageous material system is provided by compounds of indium, gallium and arsenic. A dual heterojunction step recovery diode fabricated of these materials includes: an intrinsic region 2001 comprising a compound of indium, gallium, arsenic and phosphorus characterized as InGaAsP, and a wide bandgap p region 2002 and and a wide bandgap n region 2003 each comprising a compound of indium and phosphorus, as shown in FIG. 20. A narrow bandgap contact p region 2004 and a narrow bandgap contact n region 2005 each comprise a compound of indium, gallium and arsenic. The contact region 2005 is formed on a substrate 2006. Zinc serves as a dopant for the p regions 2002 and 2004, and selenium serves as a dopant for the n regions 2003 and 2005.

The indium system is an advantageous material system because a diode fabricated of these materials exhibits a lower surface recombination rate than the diode fabricated of gallium arsenide and related materials as shown in FIG. 5.

Figure 9:
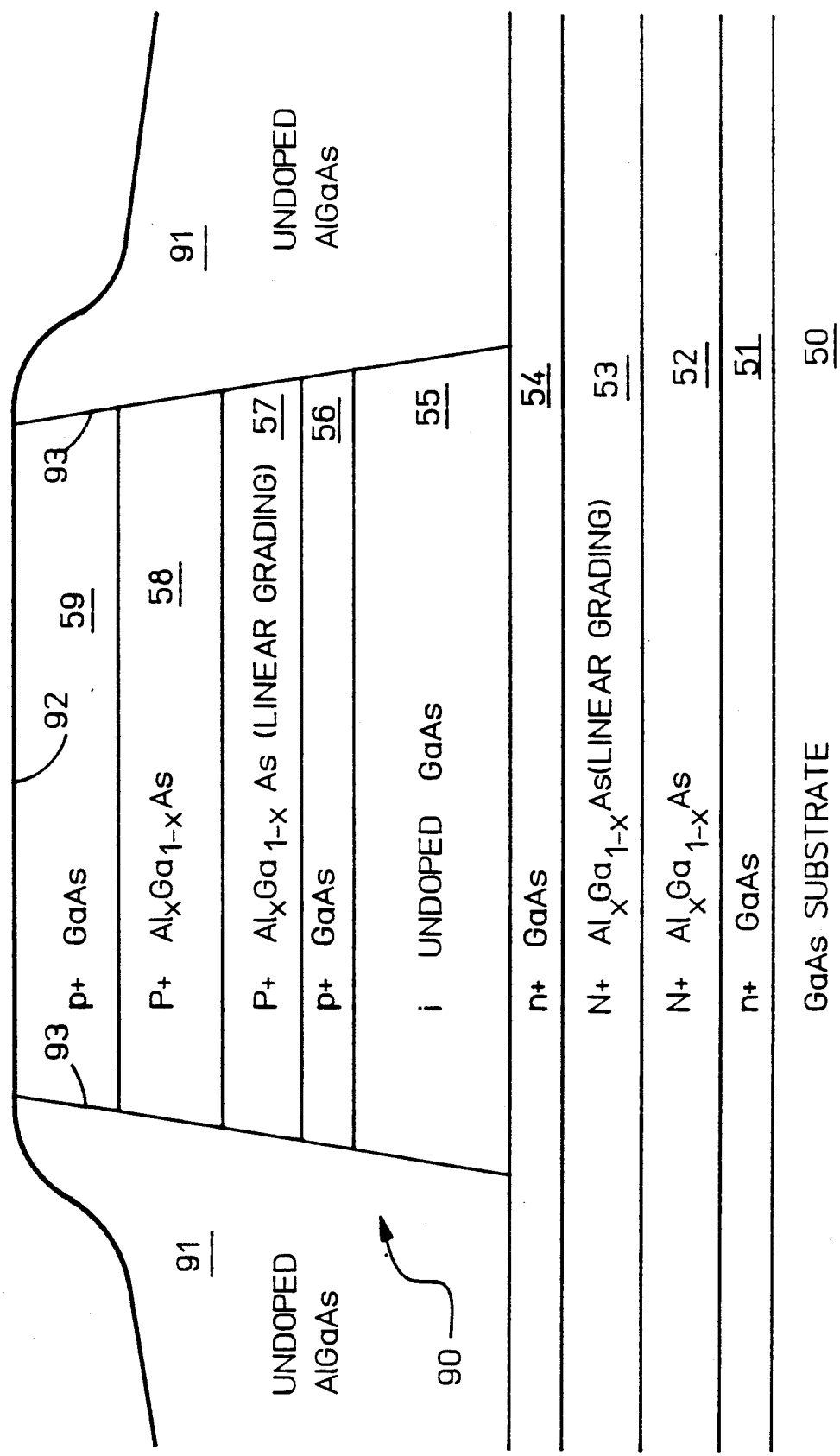
FIG. 9 illustrates an alternate embodiment of the invention in which a diode similar to the diode of FIG. 5 is embedded in undoped wide bandgap material.

In another embodiment, a further decrease in step transition time is achieved by embedding the diode in undoped wide bandgap material, for example by surrounding and covering exposed portions of the intrinsic region and the wide bandgap p region with such material as shown in FIG. 9. In this embodiment, a diode structure such as that shown in FIG. 5 is etched down to the bottom of the intrinsic region to produce a mesa structure 90. An undoped compound of aluminum, gallium and arsenic 91 is then deposited around the diode, covering the intrinsic and p regions. The advantage afforded by this structure is explained as follows.

It is well known that injected carriers recombine at semiconductor surfaces. For a general discussion of this effect, see Nelson et. al. "Inter facial Recombination Velocity in AlGaAs/GaAs Heterostructures", *Applied Physics Letters*, 32(11), Jun. 1, 1978. This surface recombination effect results in a nonuniform distribution of injected carriers throughout the structure of the diode depicted in FIG. 5, increasing the step transition time because not all of the stored injected carriers are swept out of the intrinsic region simultaneously during the transition period. Also, the surface recombination effect reduces the total amount of charge that can be stored in the intrinsic region. In addition, minority carrier lifetimes are reduced, thereby lowering the effective diffusion capacitance of the diode.

Embedding the diode in undoped wide bandgap material reduces surface recombination by several orders of magnitude.

Figure 10:
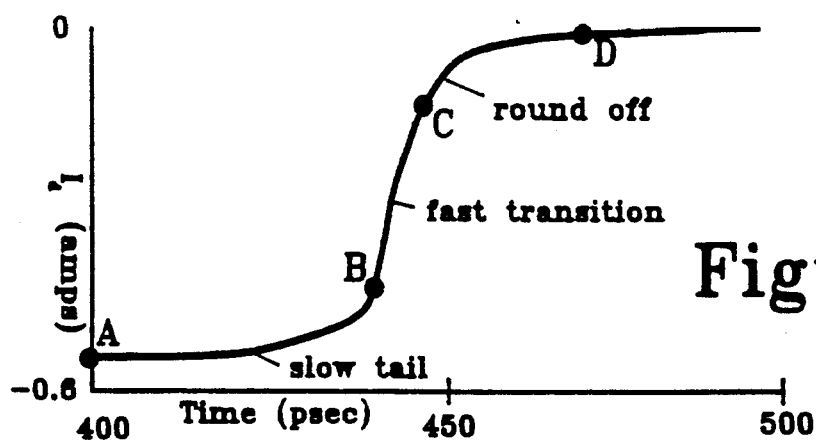
FIG. 10 depicts current flow through a conventional step recovery diode as a function of time when the applied voltage is changed from forward to reverse bias.

In another embodiment of the invention, a still further reduction in the step transition time is achieved by minimizing a "slow tail" portion of the step recovery. There are three distinct phases in the step recovery, as shown graphically in FIG. 10. During the first phase or "slow tail" portion (between points A and B) the reverse current through the diode gradually decreases as the charge carriers drift and diffuse out of the intrinsic region.

During the second phase (between points B and C) the current falls off rapidly as the tail ends of the electron and hole distributions are pushed out of the intrinsic region by an increasing electric field generated by the reverse bias voltage across the intrinsic region.

Finally, in the third phase (between points C and D) the current falls off more slowly, describing a "rounded-off" curve as determined by the RC time constant $T_{RC}$. As discussed previously with reference to FIG. 3A, the resistive factor in the time constant is determined by any source and load impedances imposed by a circuit to which the diode is connected and by the internal resistance of the diode, and the capacitive factor is the depletion or reverse bias capacitance of the diode.

The invention provides two ways of reducing the "slow tail" portion of the step recovery, both of which involve utilizing a lightly-doped region for the charge storage region.

In the first of these ways, the charge storage region comprises a p-type material having a doping level lower than that of the wide bandgap region and operative to urge the charge carriers out of the charge storage region under reverse bias. The mechanism by which such p-type doping speeds up the charge carriers, especially during the time the last few carriers are exiting the charge storage region, will now be explained.

As taught by Wolfe, Holonyak and Stillman in *Physical Properties of Semiconductors* at pages 251-253, electrons have a mobility $\mu_N$ that is more than 10 times larger than the mobility $\mu_P$ of the holes. The diffusion rate $D_N$ of the electrons and the diffusion rate $D_P$ of the holes are related to the electron and hole mobilities by the Einstein relations $$D_N = kT\mu_N/q$$

and $$D_P = kT\mu_P/q$$

where k is Boltzmann's constant and T is the temperature expressed in degrees Kelvin.

Figure 11:
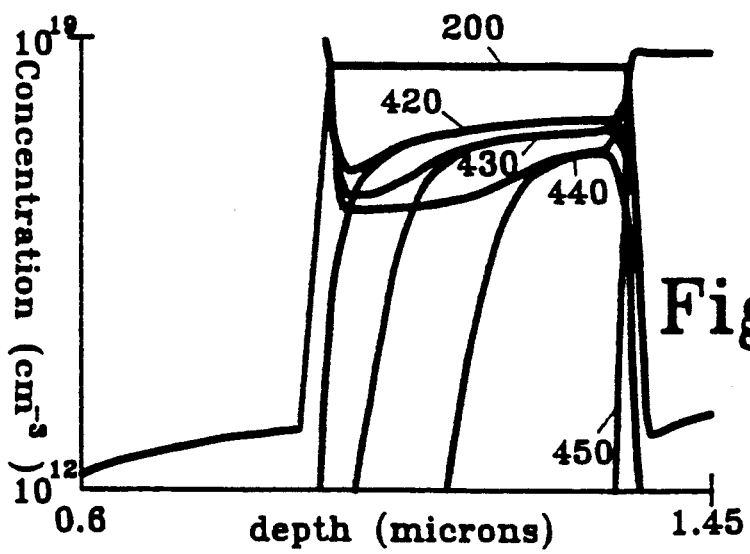
FIG. 11 shows the separation of positive and negative charge carriers in the intrinsic region of a conventional step recovery diode during step transition.

Because $D_N$ is so much larger than $D_P$, when the applied bias voltage is switched from forward to reverse bias the holes and electrons will initially diffuse from their forward-bias concentration gradients at different rates. This difference in the diffusion rates of the holes and the electrons results in a small charge separation, as shown in FIG. 11.

Figure 12:
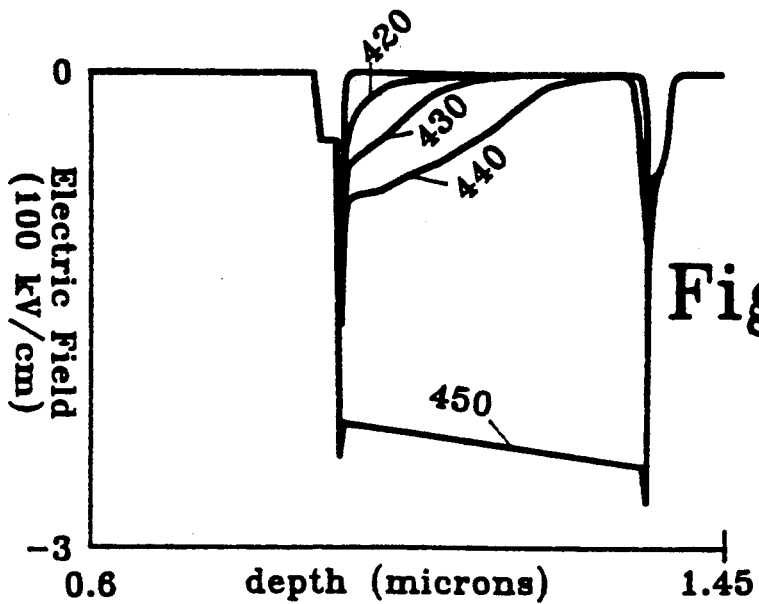
FIG. 12 shows the electric field which is developed in the intrinsic region by the separation of charge carriers shown in FIG. 11.

It takes about 420 picoseconds after the applied voltage is switched from forward to reverse bias for the electron and hole concentration distributions to begin to diverge as a result of the different diffusion rates. This charge separation creates an internal electric field in a direction that impedes the diffusion of the electrons and speeds the diffusion of the holes until they both diffuse together at a common diffusion rate referred to as the ambipolar diffusion rate $D_A$. The buildup of this electric field is depicted in FIG. 12.

The ambipolar diffusion rate $D_A$ is related to the electron and hole diffusion rates by the relationship $$D_A = \frac{(p + n)D_P D_N}{pD_P + nD_N}$$

where n is the net electron concentration and p is the net hole concentration. Therefore, the ambipolar diffusion rate is within the range $D_P < D_A < D_N$ and can be made approximately equal to $D_N$ by choosing $p \gg n$. Therefore, by p-doping the charge storage region sufficiently, the ambipolar diffusion rate $D_A$ can be made almost as fast as the electron diffusion rate $D_N$. Thus, the common rate at which the holes and electrons depart is increased over what it would be in the absence of such doping. This is why doping the charge storage region increases the rate at which the charge carriers move out. The amount of p-type doping is limited by the breakdown voltage needed.

In the second way of reducing the slow tail portion of the step recovery, the charge storage region comprises built-in electric field means for increasing the rate at which charge carriers diffuse out of the charge storage region. As used herein, "built-in" means arising from the structure of the material, not from any applied electric potential. The electric field is preferably generated by a doping gradation or a bandgap gradation in the charge storage region. If a doping gradation is used, it should be a p-type doping so as to also increase the speed of the charge diffusion by increasing the ambipolar diffusion rate as previously described. The electric field preferably extends throughout the charge storage region because the holes have a lower inherent diffusion rate than do the electrons.

Figure 17:
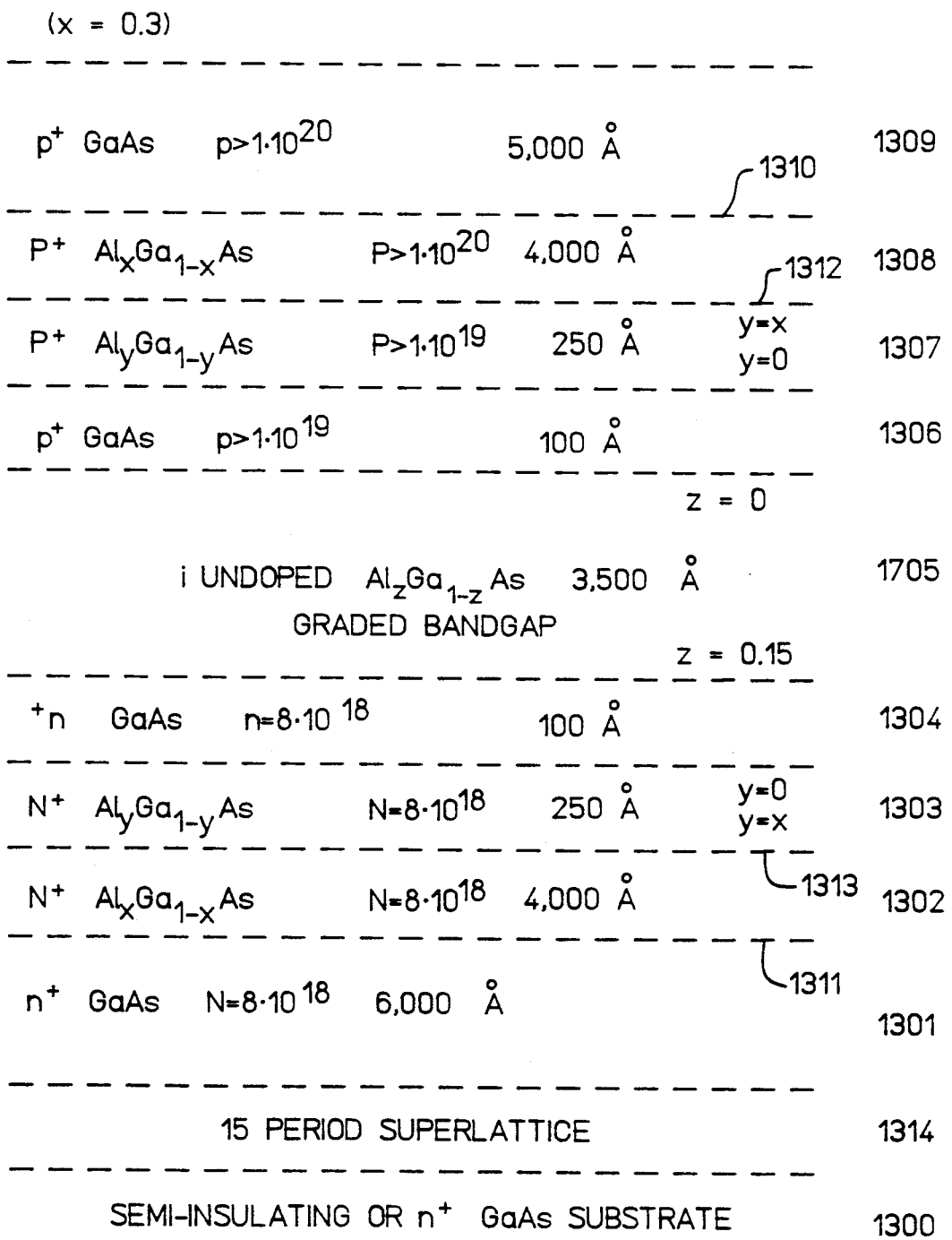
FIG. 17 illustrates a step recovery diode similar to the one shown in FIG. 13 in which the charge storage region is characterized by a gradation in bandgap width.

FIGS. 13, 14 and 17 illustrate particular embodiments of step recovery diodes in which the slow tail portion of the step recovery is reduced in the manner described above. The diode depicted in FIG. 13 is similar to the one shown in FIG. 5 except that the intrinsic region has been replaced by a charge storage region 1305. The other regions 1300–1304 and 1306–1309 are similar to the regions 50–54 and 56–59, respectively, except as noted in the following paragraphs. This structure can be fabricated by any of the techniques discussed with reference to the structure of FIG. 5. Similar elements and compounds are used, and similar dopants may be employed.

The charge storage region 1305 is a p-doped region of thickness about 4,000 Å in which bulk storage of both types of minority carriers occurs under forward bias. The wide bandgap regions 1302 and 1308 each are less than about 4,000 Å thick.

The graded bandgap regions 1303 and 1307, which may be omitted entirely if desired, are preferably each about 250 Angstroms thick. The graded bandgap p region 1307 comprises a compound of aluminum, gallium and arsenic expressed as $Al_yGa_{1-y}As$, wherein the value of y varies between the same value as x at the junction 1312 between the graded bandgap region 1307 and the wide bandgap p region 1308, and zero at its opposite boundary.

An additional region 1314 is preferably provided between the substrate 1300 and the n-type contact region 1301. The region 1314 is a 15 period super lattice of thickness less than 1,000 Angstroms which provides a more uniform heterojunction growth.

The level of doping in the charge storage region 1305 is chosen such that this region will be fully depleted before the breakdown voltage of this region is reached when a reverse bias voltage is applied. In general, this requires that the dopant concentration in the region 1305 be about $10^{16}–10^{17}$ cm$^{-3}$. The p-type doping cannot be so high that excessive rounding occurs during the round off region of FIG. 10. In the embodiment shown, the dopant level is about $10^{17}$ cm$^{-3}$ for a 4,000 Å thick region and a breakdown voltage of 15 volts. At this doping level excessive rounding does not occur.

Figure 21:
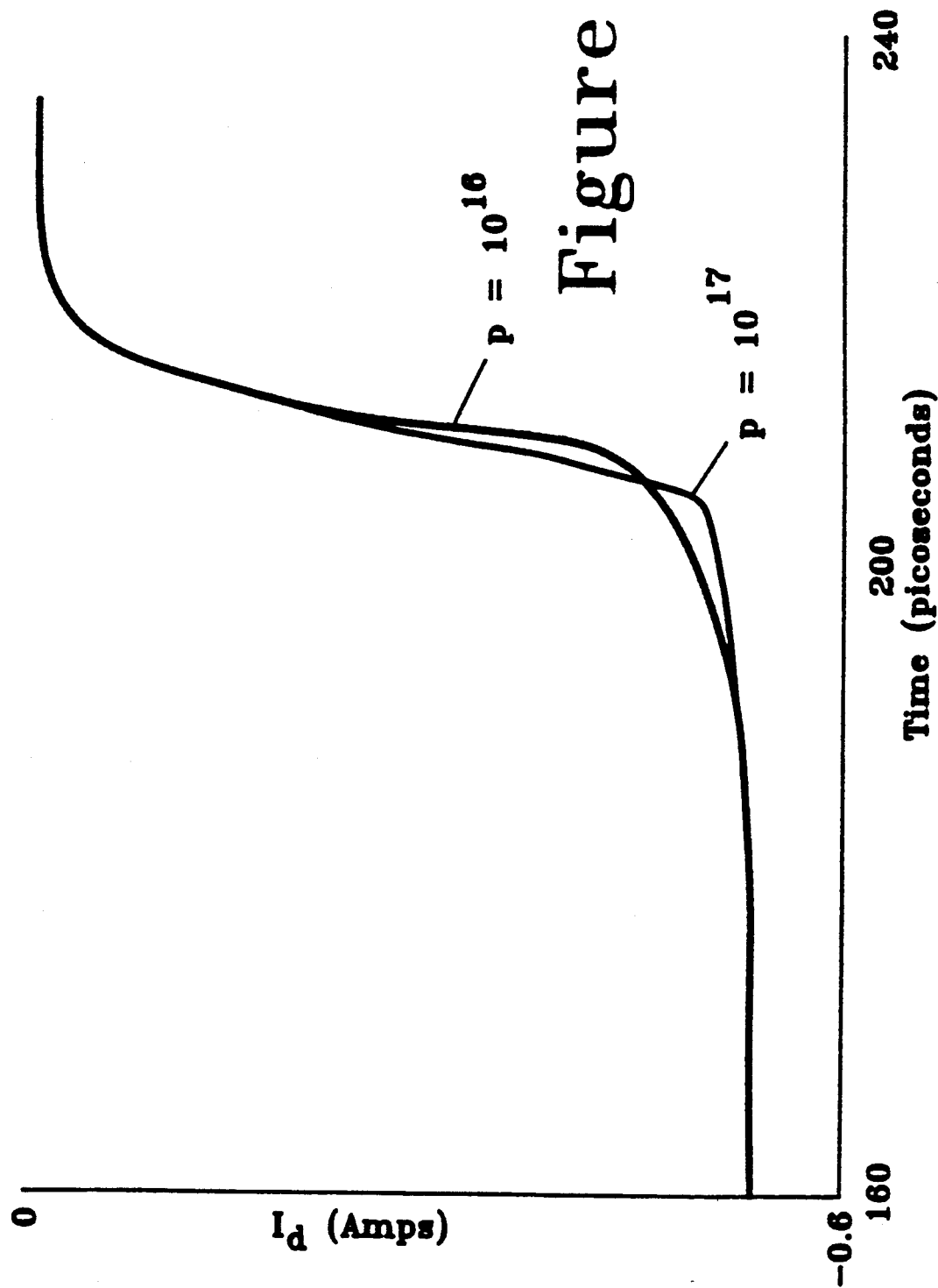
FIG. 21 compares the current flow through two step recovery diodes of the kind shown in FIG. 13, one having a doping level of $10^{16}$ cm$^{-3}$ in its charge storage region and the other having a doping level of $10^{17}$ cm$^{-3}$ in that region, as a function of time when the applied voltage is changed from forward to reverse bias.

FIG. 21 shows that a level of doping of at least $10^{17}$ cm$^{-3}$ in the charge storage region 1305 produces a significant reduction of the slow tail region as compared with a doping level of $10^{16}$ cm$^{-3}$, thereby producing a more abrupt step transition.

FIG. 14 presents an alternate embodiment that is identical to that shown in FIG. 13 except that the charge storage region 1305 of FIG. 13 is replaced with charge storage region 1405 having a p-type dopant level that varies approximately linearly between a level of about $10^{17}$ cm$^{-3}$ at a boundary 1414 between the region 1405 and the narrow bandgap p region 1306, and a level of about $5 \cdot 10^{14}$ cm$^{-3}$ at a boundary 1415 between the region 1405 and the narrow bandgap n region 1304. The effect of this graded dopant level will now be explained with reference to FIGS. 15 and 16.

Figure 15:
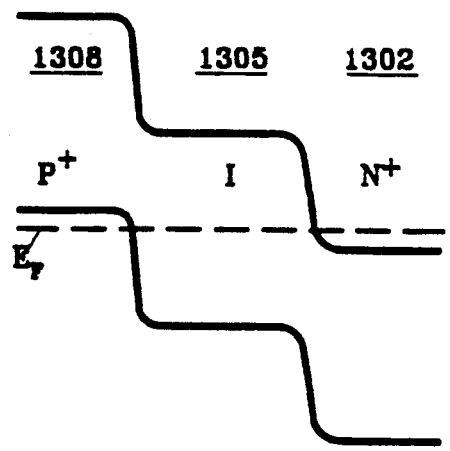
FIG. 15 is an energy diagram of a conventional step recovery diode of the kind shown in FIG. 2.
Figure 16:
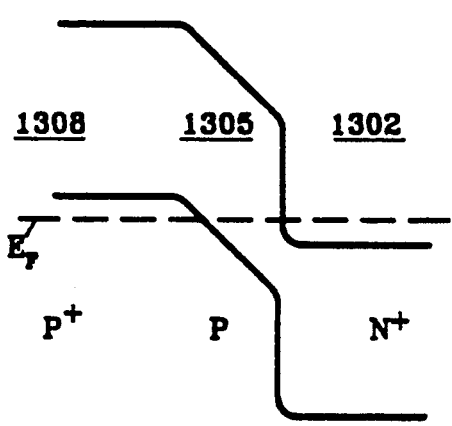
FIG. 16 is an energy diagram of a step recovery diode of the kind shown in FIG. 14.

FIG. 15 is an energy diagram of the diode shown in FIG. 13, and FIG. 16 is an energy diagram of the diode shown in FIG. 14. The grading of the dopant level in the region 1405 produces sloping energy bands within the region 1405. These sloping energy bands indicate the existence of an electric field within the region.

When the voltage applied to this diode is switched to reverse bias and the concentration density of charge carriers within the charge storage region has been removed to the point where it is below the background p-type impurity level, this electric field will push electrons toward the region 1302 and holes toward the region 1308, thereby minimizing the "slow tail" portion of the step recovery.

Another advantage of the graded dopant level is that the breakdown voltage is higher than the breakdown voltage of a uniformly doped p-type charge storage region.

It should also be noted from FIGS. 15 and 16 that the p+ and n+ dopant levels in regions 1308 and 1302, respectively, are sufficiently large that these regions are degenerately doped. That is, the bottom of the conduction band in the region 1302 and the top of the valence band in the region 1308 are located approximately at the Fermi energy level $E_F$.

Figure 18:
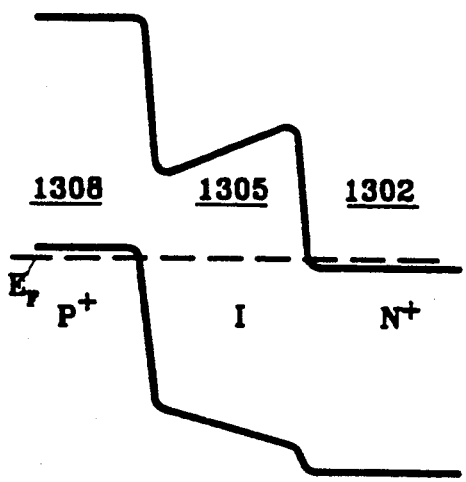
FIG. 18 is an energy diagram of a step recovery diode of the kind shown in FIG. 17.
Figure 19:
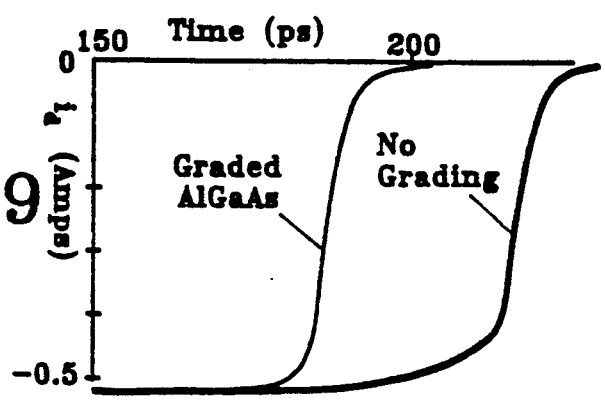
FIG. 19 depicts the effect of a gradation in bandgap width on the current flowing through a step recovery diode as a function of time when the applied voltage is changed from forward to reverse bias.

FIG. 17 illustrates a step recovery diode similar to the one illustrated in FIG. 13 in which the p-doped charge storage region 1305 has been replaced with an undoped, graded bandgap charge storage region 1705. The energy diagram for this diode is depicted in FIG. 18. The tilt of the boundaries of the band gap in the charge storage region indicates the presence of an electric field. This produces the same type of effect as the graded dopant level of the embodiment shown in FIG. 14. FIG. 19 illustrates the reduction of the slow tail produced by the embodiment of FIG. 18.

A graded bandgap charge storage region serves to confine the majority of holes closer to its point of exit thereby reducing the length of time it needs to diffuse out.

From the foregoing it will be apparent that a double heterojunction step recovery diode according to the invention provides a step voltage having a transition time of less than 10 picoseconds and a magnitude of more than 15 volts. This is accomplished, as described in detail above, by such novel features as the double heterostructure that results from the use of wide and narrow bandgap materials, the use of graded bandgap materials, and the use of a charge storage region that reduces the "slow tail" portion of the step recovery.

Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

We claim:

1. A double heterostructure step recovery diode comprising:
    an intrinsic charge storage region;
    a wide bandgap p-type region having wider bandgap than the charge storage region and forming a heterojunction therewith;
    a wide bandgap n-type region having a wider bandgap than the charge storage region and forming a heterojunction therewith; and
    a graded bandgap region between the intrinsic region and one of the wide bandgap regions, characterized by a generally continuous gradation in bandgap between the bandgap of the intrinsic region and that of the wide bandgap region, application of a forward bias voltage across the diode resulting in an accumulation of charge carriers in the charge storage region and a low impedance through the diode, and switching the polarity of the voltage to a reverse bias resulting in a sweeping of the charge carriers out of the charge storage region, during which the impedance through the diode remains low, and then in a step recovery which takes place when substantially all the charge carriers have been swept out of the charge storage region, during which the impedance abruptly increases.

2. A diode as in claim 1 wherein the intrinsic region comprises gallium arsenide and one of the wide bandgap regions comprises a compound of aluminum, gallium and arsenic characterized as $Al_xGa_{1-x}As$.

3. A diode as in claim 1 wherein the intrinsic region comprises a compound of indium, gallium, arsenic and phosphorus characterized as InGaAsP and one of the wide bandgap regions comprises a compound of indium and phosphorus.

4. A diode as in claim 1 and further comprising undoped wide bandgap material surrounding and covering exposed portions of the intrinsic region and one of the wide bandgap regions.

5. A double heterostructure step recovery diode comprising:
- an intrinsic charge storage region;
- a wide bandgap p-type region having a wider bandgap than the charge storage region and forming a heterojunction therewith;
- a wide bandgap n-type region having a wider bandgap than the charge storage region and forming a heterojunction therewith; and
- a narrow bandgap p-type region between the intrinsic region and the wide bandgap p region and a narrow bandgap n-type region between the intrinsic region and the wide bandgap n region,
- application of a forward bias voltage across the diode resulting in an accumulation of charge carriers in the charge storage region and a low impedance through the diode, and
- switching the polarity of the voltage to a reverse bias resulting in a sweeping of the charge carriers out of the charge storage region, during which the impedance through the diode remains low, and then in a step recovery which takes place when substantially all the charge carriers have been swept out of the charge storage region, during which the impedance abruptly increases.

6. A diode as in claim 5 wherein the intrinsic region comprises gallium arsenide and one of the wide bandgap regions comprises a compound of aluminum, gallium and arsenic characterized as $Al_xGa_{1-x}As$.

7. A diode as in claim 5 wherein the intrinsic region comprises a compound of indium, gallium, arsenic and phosphorus characterized as InGaAsP and one of the wide bandgap regions comprises a compound of indium and phosphorus.

8. A diode as in claim 5 and further comprising undoped wide bandgap material surrounding and covering exposed portions of the intrinsic region and the wide bandgap p region.

9. A diode as in claim 5 wherein one of the narrow bandgap regions is thinner than a photon absorption length as determined by the energy level of any photons that may be generated by radiative recombination in the intrinsic region, and wherein the adjacent wide bandgap region is substantially transparent to photons having said energy level, whereby any such photons entering the narrow bandgap region from the intrinsic region tend to pass through the narrow bandgap region and the adjacent wide bandgap region without generating significant numbers of minority carriers in either said region.

10. A double heterostructure step recovery diode comprising:
- an intrinsic charge storage region, the intrinsic region comprising a compound of germanium and silicon characterized as $Ge_xSi_{1-x}$;
- a wide bandgap p-type region having a wider bandgap than the charge storage region and forming a heterojunction therewith; and
- a wide bandgap n-type region having a wider bandgap than the charge storage region and forming a heterojunction therewith,
- one of the wide bandgap regions comprising silicon,
- application of a forward bias voltage across the diode resulting in an accumulation of charge carriers in the charge storage region and a low impendance through the diode, and
- switching the polarity of the voltage to a reverse bias resulting in a sweeping of the charge carriers out of the charge storage region, during which the impendance through the diode remains low, and then in a step recovery which takes place when substantially all the charge carriers have been swept out of the charge storage region, during which the impendance abruptly increases.

11. A diode as in claim 10 wherein the quantity x has a value between about 0.1 and 0.3.

12. A diode as in claim 10 and further comprising a sapphire substrate.

13. A diode as in claim 10 and further comprising undoped wide bandgap material surrounding and covering exposed portions of the intrinsic region and the wide bandgap p region.

14. A double heterostructure step recovery diode comprising:
- a charge storage region;
- a wide bandgap p-type region having a wider bandgap than the charge storage region and forming a heterojunction therewith;
- a wide bandgap n-type region having a wider bandgap than the charge storage region and forming a heterojunction therewith; and
- a graded bandgap region between the intrinsic region and one of the wide bandgap regions, characterized by a generally continuous gradation in bandgap between the bandgap of the charge storage region and that of the wide bandgap region,
- application of a forward bias voltage across the diode resulting in an accumulation of charge carriers in the charge storage region and a low impendance through the diode, and
- switching the polarity of the voltage to a reverse bias resulting in a sweeping of the charge carriers out of the charge storage region, during which the impendance through the diode remains low, and then in a step recovery which takes place when substantially all the charge carriers have been swept out of the charge storage region, during which the impendance abruptly increases;
- the charge storage region haivng a p-type dopant at a doping level less than that of the wide bandgap p region and operative to urge charge carriers out of the charge storage region under reverse bias conditions and thereby minimize the duration of any slow tail portion of the step recovery.

15. A double heterostructure step recovery diode comprising:
   a charge storage region including built-in electric field means in addition to that inherent in a PIN diode structure, operative to provide a static electric filed and thereby urge charge carriers out of the charge storage region under reverse bias conditions and thereby minimize the duration of any slow tail portion of the step recovery;
   a wide bandgap p-type region having a wider bandgap than the charge storage region and forming a heterojunction therewith; and
   a wide bandgap n-type region having a wider bandgap than the charge storage region and forming a heterojunction therewith,
   application of a forward bias voltage across the diode resulting in an accumulation of charge carriers in the charge storage region and a low impedance through the diode, and
   switching the polarity of the voltage to a reverse bias resulting in a sweeping of the charge carriers out of the charge storage region, during which the impedance through the diode remains low, and then in step recovery which takes place when substantially all the charge carriers have been swept out of the charge storage region, during which the impendance abruptly increases.

16. A diode as in claim 15 wherein the charge storage region comprises gallium arsenide and one of the wide bandgap regions comprises a compound of aluminum, gallium and aresnic characterized as $Al_xGa_{1-x}As$.

17. A diode as in claim 15 wherein the charge storage region comprises a compound of indium, gallium, arsenic and phosphorus characterized as InGaAsP and one of the wide bandgap regions comprises a compound of indium and phosphorous.

18. A double heterostructure step recovery diode comprising:
   a charge storage region characterized by a doping gradation therein, the doping gradation operative to provide an electric field that urges charge carriers out of the charge storage region under reverse bias conditions and thereby minimizes the duration of any slow tail portion of the step recovery;
   a wide bandgap p-type region having a wider bandgap than the charge storage region and forming a heterojunction therewith; and
   a wide bandgap n-type region having a wider bandgap than the charge storage region and forming a heterojunction therewith,
   application of a forward bias voltage across the diode resulting in an accumulation of charge carries in the charge storage region and a low impedance through the diode, and
   switching the polarity of the voltage to a reverse bias resulting in a sweeping of the charge carriers out of the charge storage region, during which the impedance through the diode remains low, and then in a step recovery which takes place when substantially all the charge carriers have been swept out of the charge storage region, during which the impedance abruptly increases.

19. A double heterostructure step recovery diode comprising:
   a charge storage region characterized by a bandgap gradation therein, the bandgap gradation operative to provide an electric field that urges charge carriers out of the charge storage region under reverse bias conditions and therby minimizes the duration of any slow tail portion of the step recovery;
   a wide bandgap p-type region having a wider bandgap than the charge storage region and forming a heterojunction therewith; and
   a wide bandgap n-type region having a wider bandgap than the charge storge region and forming a heterojunction therewith,
   application of a forward bias voltage across the diode resulting in an accumulation of charge carriers in the charge storage region and a low impedance through the diode, and
   switching the polarity of the voltage to a reverse bias resulting in a sweeping of the charge carriers out of the charge storage region, during which the impedance through the diode remains low, and then in a step recovery which takes place when substantially all the charge carriers have been swept out of the charge storage region, during which the impendance abruptly increases.

20. A dual heterostructure step recovery diode comprising:
   a contact p-type region having a relatively narrow bandgap;
   a wide bandgap p-type region adjacent the contact p region and forming a heterojunction therewith;
   a narrow bandgap p-type region adjacent the wide bandgap p region and forming a heterojunction therewith;
   a charge storage region adjacent the narrow bandgap p region and having a bandgap substantially similar thereto;
   a narrow bandgap n-type region adjacent the charge storage region;
   a wide bandgap n-type region adjacent the narrow bandgap n region and forming a heterojunction therewith; and
   a contact n-type region adjacent the wide bandgap n region and forming a heterojunction therewith.

21. A diode as in claim 20 wherein the charge storage region comprises a p-type dopant at a doping level less than that of the wide bandgap p region and operative to urge charge carriers out of the charge storage region under reverse bias conditions.

22. A diode as in claim 20 wherein the charge storage region comprises built-in electric field means operative to urge charge carriers out of the charge storage region under reverse bias conditions.

* * * * *